United States Patent [19]
Hiura et al.

[11] Patent Number: 5,586,073
[45] Date of Patent: Dec. 17, 1996

[54] SEMICONDUCTOR DEVICE HAVING A MULTI-LAYER CHANNEL STRUCTURE

[75] Inventors: Yohei Hiura, Ichikawa; Seiji Yamada, Tokyo; Kuniyoshi Yoshikawa, Tokyo, all of Japan

[73] Assignee: Kabushiki Kaisha Toshiba, Kawasaki, Japan

[21] Appl. No.: 361,505

[22] Filed: Dec. 22, 1994

[30] Foreign Application Priority Data

Dec. 27, 1993 [JP] Japan .................................. 5-348577

[51] Int. Cl.$^6$ .................................................. G11C 11/40
[52] U.S. Cl. .............................. 365/185.01; 365/185.17; 365/185.24
[58] Field of Search ............................. 365/185, 185.24, 365/185.17; 257/404, 345, 315, 316, 319, 403

[56] References Cited

U.S. PATENT DOCUMENTS

| | | | |
|---|---|---|---|
| 4,467,452 | 8/1984 | Saito et al. ............................. | 257/404 |
| 5,243,210 | 9/1993 | Naruke ................................... | 257/404 |

FOREIGN PATENT DOCUMENTS

| | | | |
|---|---|---|---|
| 5635472 | 4/1981 | Japan ...................................... | 257/345 |

OTHER PUBLICATIONS

H. Oda et al., "FLASH Memory Cell Using Buried Channel Type n–MOSFET", Extended Abstracts (The 40th Spring Meeting, 1993) The Japan Society of Applied Physics and Related Societies, No. 2, p. 741, dated Mar. 29, 1993.

H. Oda et al; Extended Abstracts (The 40th Spring Meeting, 1993) The Japan Society of Applied Physics and Relates Societies No. 2, p. 741, FLASH Memory Cell Using Buried Channel Type n–MOSFET, H. dated Mar. 29, 1993, discloses Flash memory cell in which the difference of the electrical condition of the channel area between the read operation and the program operation is not restricted.

S. M. Sze, Physics of Semiconductor Devices, pp. 464–469, §8.3.3. "Buried–Channel Devices", 1981.

*Primary Examiner*—David C. Nelms
*Assistant Examiner*—Vu A. Le
*Attorney, Agent, or Firm*—Banner & Allegretti, Ltd.

[57] ABSTRACT

A non-volatile semiconductor memory cell has a channel layer with a two-layered structure including a surface channel layer and a buried channel layer. The operation of reading out "1" level data or "0" level data from the memory cell is effected by using only the buried channel layer and based on whether the conductivity type of the buried layer is inverted or not. The operation of writing "0" level data is effected by using both of the surface channel layer and the buried channel layer, simultaneously inverting the conductivity types of the surface channel layer and the buried channel layer, and passing a current into the inverted layer to generate hot electrons.

89 Claims, 11 Drawing Sheets

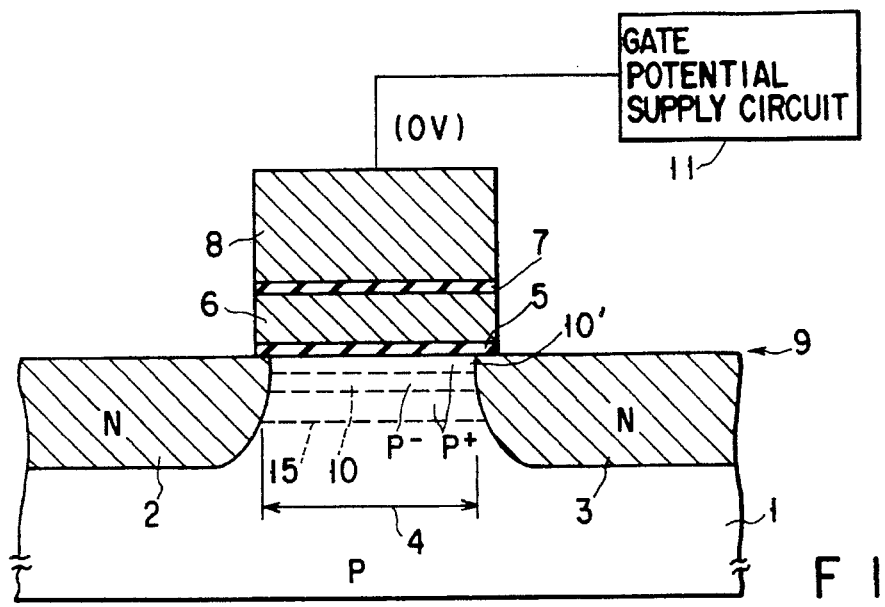
F I G. 11
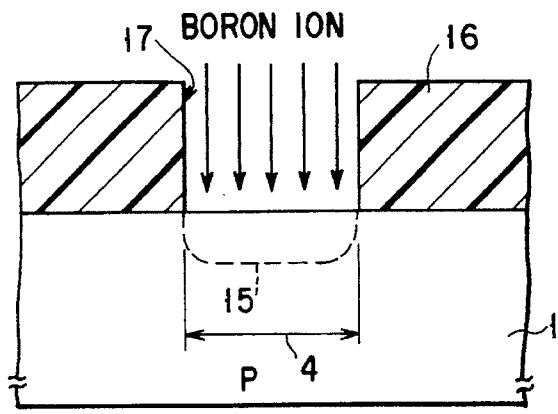
F I G. 12A
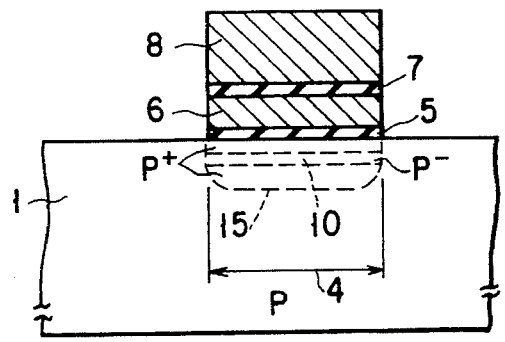
F I G. 12C
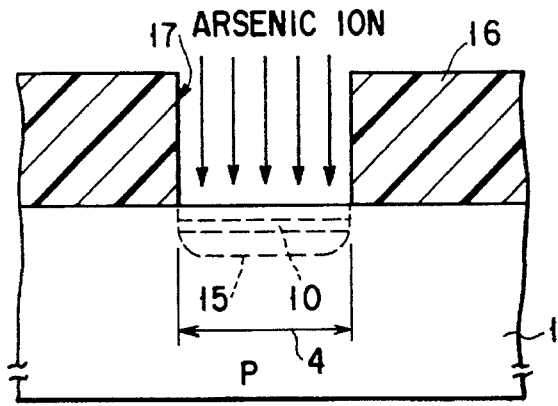
F I G. 12B
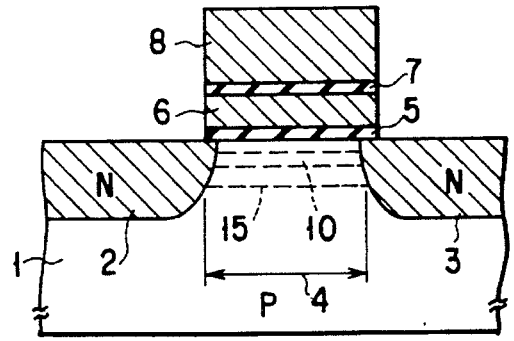
F I G. 12D

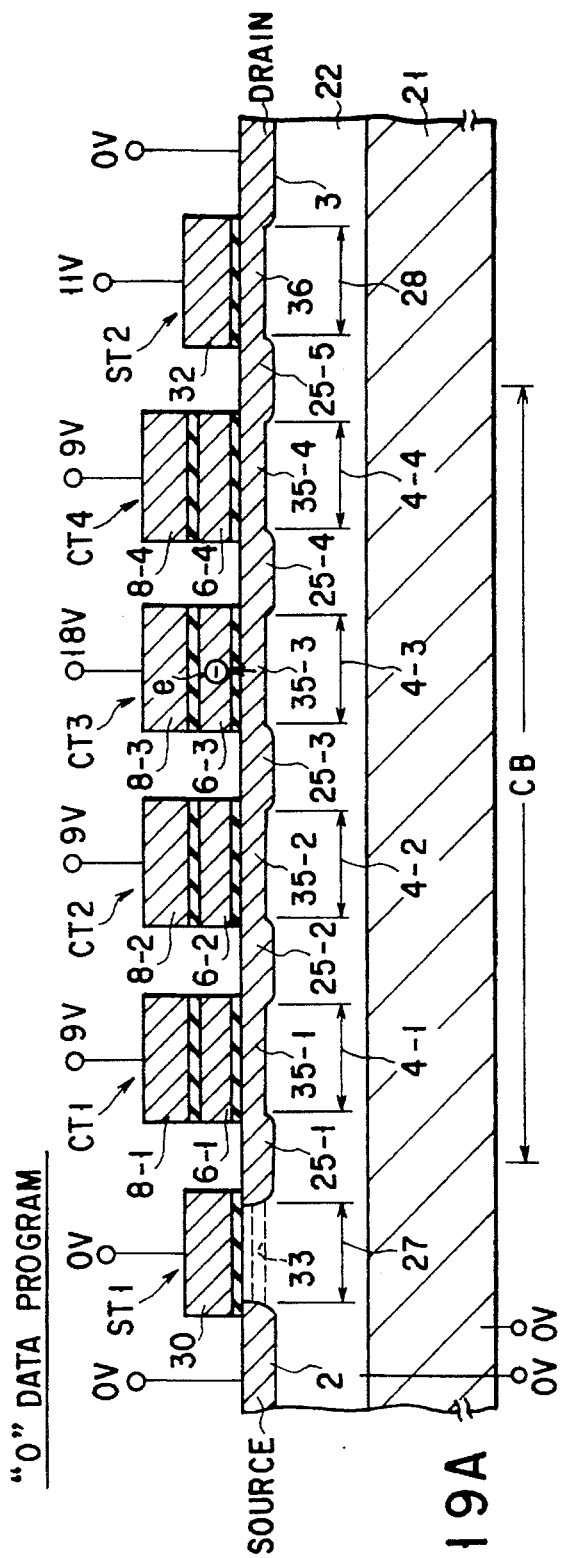
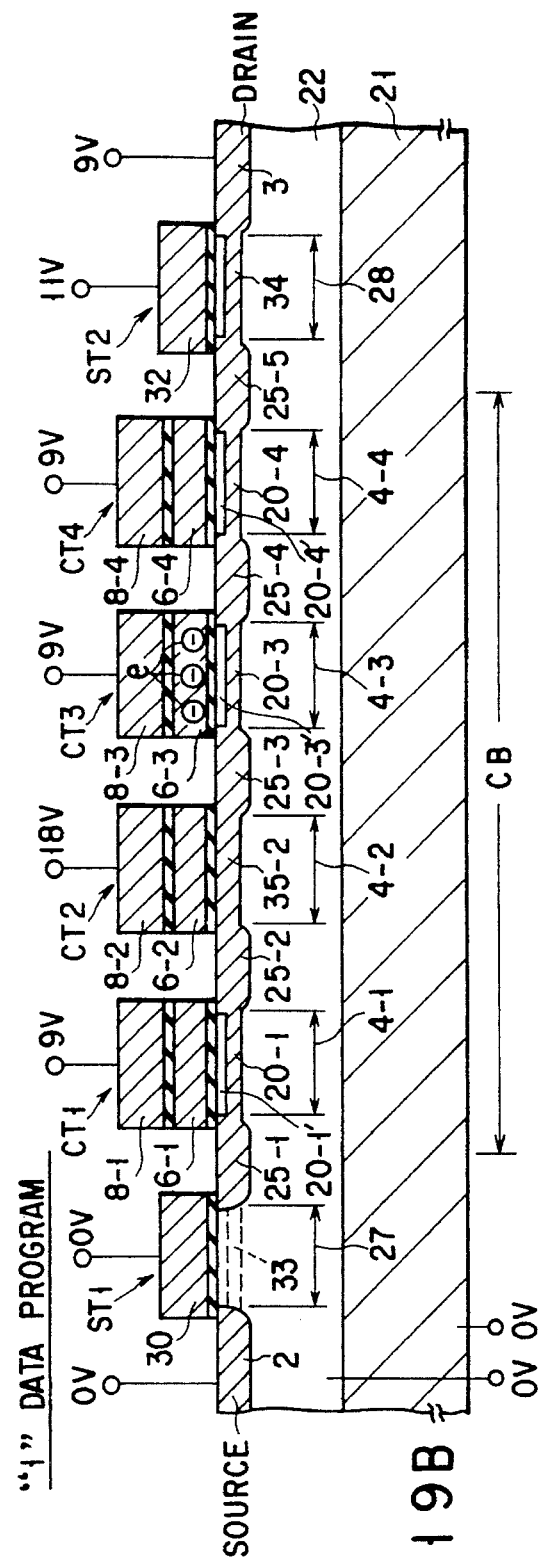

SEMICONDUCTOR DEVICE HAVING A MULTI-LAYER CHANNEL STRUCTURE

BACKGROUND OF THE INVENTION

1. Field of the Invention

This invention relates to a non-volatile semiconductor memory device and more particularly to the improvement of a channel region of a memory cell.

2. Description of the Related Art

FIG. 1 is a cross sectional view of a general memory cell which is used in an electrically data programmable and erasable non-volatile semiconductor memory device, and FIG. 2 is a diagram showing the impurity profile along the A—A line in FIG. 1.

As shown in FIG. 1, a P-type silicon substrate 1 containing boron (B) of approximately $10^{18}$ cm$^{-3}$ is used and an N-type source diffused layer 2 and an N-type drain diffused layer 3 are separately formed in the substrate 1. A portion of the substrate 1 which lies between the diffused layers 2 and 3 is defined as a P-type channel region 4. A first gate insulation film 5 of silicon dioxide is formed on the channel region 4 and a floating gate 6 of polysilicon is formed on the first gate insulation film 5. A second gate insulation film 7 of silicon dioxide is formed on the floating gate 6 and a control gate 8 of polysilicon is formed on the second gate insulation film 7.

The impurity profile in the channel region of the memory cell with the above structure is shown in FIG. 2.

The line I in FIG. 2 indicates the boron profile. As indicated by the line I, the channel region has a P-type which is the same conductivity type as that of the substrate 1 and the concentration thereof is approximately $10^{18}$ cm$^{-3}$ and substantially uniform in the depth direction of the channel region 4.

Next, the operation of the memory cell shown in FIG. 1, particularly, the readout operation thereof is explained below.

FIG. 3A is a cross sectional view for illustrating the readout operation effected when a large amount of electrons are present in the floating gate, and FIG. 3B is a cross sectional view for illustrating the readout operation effected when only a small amount of electrons are present in the floating gate.

First, as shown in FIG. 3A, when a large amount of electrons e are present in the floating gate 6, the threshold voltage of the cell is increased. Therefore, even if a readout voltage of 5 V (VCC) is applied to the control gate 8, an inverted layer is not formed in the channel region 4. As a result, the cell is kept in the non-conductive state.

On the other hand, as shown in FIG. 3B, when only a small amount of electrons e are present in the floating gate 6, the threshold voltage of the cell becomes lower than that of a case shown in FIG. 3A. Therefore, when a readout voltage of 5 V is applied to the control gate 8, an inverted layer 40 is formed in the channel region 4. As a result, the cell is set into the conductive state. At this time, in the conventional memory cell, the inverted layer 40 is formed in contact with the surface 9 of the substrate 1 in the channel region 4.

In this specification, the storage state of the memory cell is defined such that "0" level data is stored when a large amount of electrons e are present in the floating gate 6 and the threshold voltage of the memory cell is high and "1" level data is stored when only a small amount of electrons e are present in the floating gate 6 and the threshold voltage of the memory cell is low.

In the memory cell shown in FIG. 1, the electrically data erasing and writing operations are effected. Particularly, at the time of data writing, a programming voltage (VPP) is applied to the control gate 8 and a voltage is applied between the source and the drain to cause a current to flow in the inverted layer 40, which generates channel hot electrons and injects the thus generated channel hot electrons into the floating gate 6. This operation is effected each time data is re-written and holes and electrons pass through the first gate insulation film 5 at each time of the operation. If holes and electrons pass through the first gate insulation film 5, an interface state 41 is formed in the interface between the surface 9 of the substrate 1 in the channel region 4 and the first gate insulation film 5. The amount of the interface state is gradually increased each time data is re-written. The interface state reduces a cell current, that is, a current flowing in the channel region 4 in the readout operation. Therefore, as the amount of the interface state is increased, the cell current is gradually reduced. Finally, almost no cell current is caused to flow, making it impossible to read out "1" level data.

As described above, in the memory cell shown in FIG. 1, it is difficult to stably readout data for a long period of time because of its structure. That is, the durability of the memory cell is not excellent.

Further, as one of the factors for determining the performance of the memory cell, the operation speed is considered. Particularly, the data writing speed is important.

However, in the memory cell shown in FIG. 1, an increase in the data writing speed is limited because of its structure. That is, the writing speed is low.

SUMMARY OF THE INVENTION

An object of this invention is to provide a non-volatile semiconductor memory device which is excellent in the durability and permits data to be written at high speed.

In order to attain the above object, a non-volatile semiconductor memory device of this invention comprises a semiconductor body; and a memory cell into which data can be written and which includes a channel region having a two-layered structure including a surface channel layer and a buried channel layer provided in the body; a gate insulation film provided on the surface channel layer, a gate provided on the gate insulation film, a gate provided on the gate insulation film and a charge storage layer provided in the gate insulation film. At the time of reading data of "1" level or "0" level from the above memory cell, only the buried channel layer is used and readout data is determined according to whether or not the conductivity type of the buried channel layer becomes equal to a conductivity type different from that of the body, and at the time of writing data of "0" level into the memory cell, both of the surface channel layer and the buried channel layer are used, the two channel layers are made to have a conductivity type different from that of the body, and a current is caused to flow into the channel layers so as to inject carriers into the charge storage layer.

In the non-volatile semiconductor memory device with the above structure, at the time of data readout, only the buried channel layer is used and the conductivity type thereof is made to have a conductivity type different from that of the body. A cell current flowing in the buried channel layer is little influenced by the interface state formed in the interface between the surface of the body and the gate insulation film. The interface state is increased with an increase in the length of the operating time of the cell. However, if the cell current comes to be less influenced by the interface state, an amount of loss of the cell current becomes extremely small even if the cell is used for a long period of time. Therefore, the rate of deterioration of the cell with the elapse of time is reduced, and it becomes possible to stably read out data for a long period of time.

Further, at the time of writing data, the cell current can be caused to flow in the deeper portion of the channel region particularly because the current flows in the buried channel layer. In the deep portion, the generation efficiency of the hot carriers is high. Therefore, a large amount of hot carriers can be generated. If a large amount of carriers are generated, the amount of carriers injected into the charge storage layer per unit length of time is increased. Thus, data can be written at high speed.

Further, a region which permits a current to flow can be formed near the gate insulation film by making the conductivity type of the surface channel layer different from that of the body. By forming the region permitting the current flow near the gate insulation film, the carrier injection efficiency is enhanced. Thus, the data writing speed can be further enhanced.

Further, by using both of the surface channel layer and the buried channel layer, the cross sectional area of the inverted layer which permits flow of the cell current is increased. As the cross sectional area is increased, the channel resistance is reduced. Since a voltage drop in the channel region is reduced as the channel resistance is reduced, the writing operation can be effected with a lower voltage.

Further, since a current flows near the gate insulation film at the time of writing data, an F-N tunnel current can be used in stead of injection of channel hot carriers to write data. In addition, since an intense electric field is applied to the gate insulation film, the F-N tunnel current tends to flow in the gate insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a cross sectional view showing a memory cell of a non-volatile semiconductor memory device according to a second embodiment of this invention;

FIGS. 12A to 12D are cross sectional views showing the main manufacturing steps for the memory cell shown in FIG. 11;

FIGS. 19A and 19B are cross sectional views for illustrating the writing operation of the memory cell shown in FIG. 17.

DETAILED DESCRIPTION OF THE PREFERRED EMBODIMENTS

Figure 1:
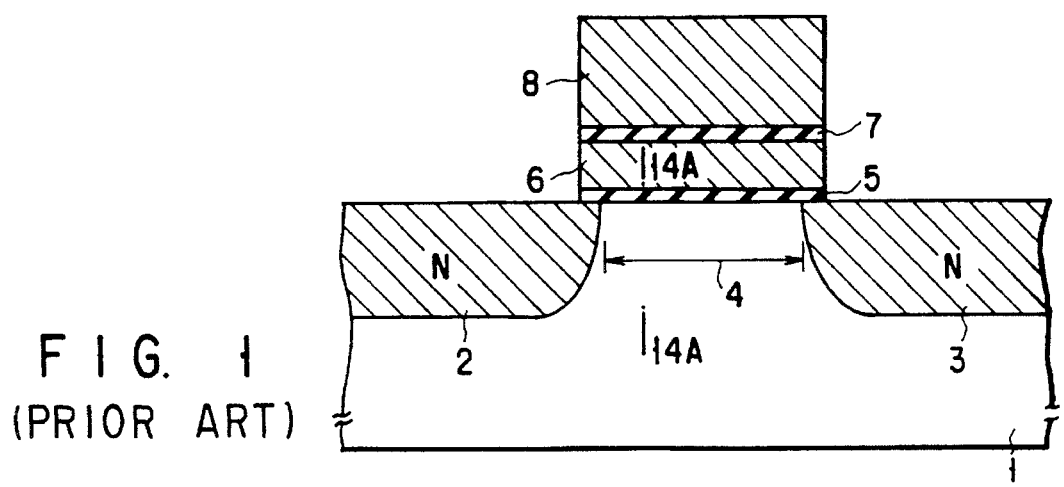
FIG. 1 is a cross sectional view showing a memory cell of the conventional non-volatile semiconductor memory device.
Figure 2:
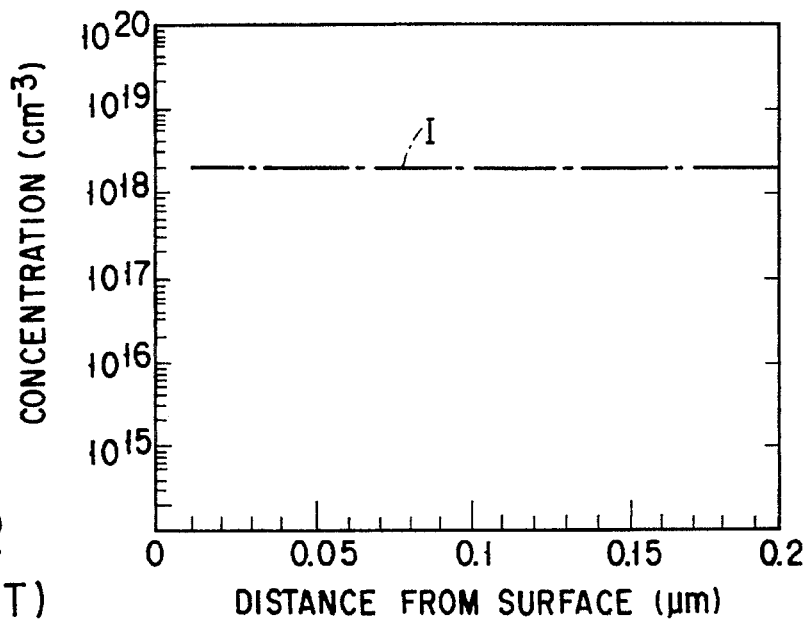
FIG. 2 is a diagram showing the impurity profile along the A—A line in FIG. 1.
Figure 3A:
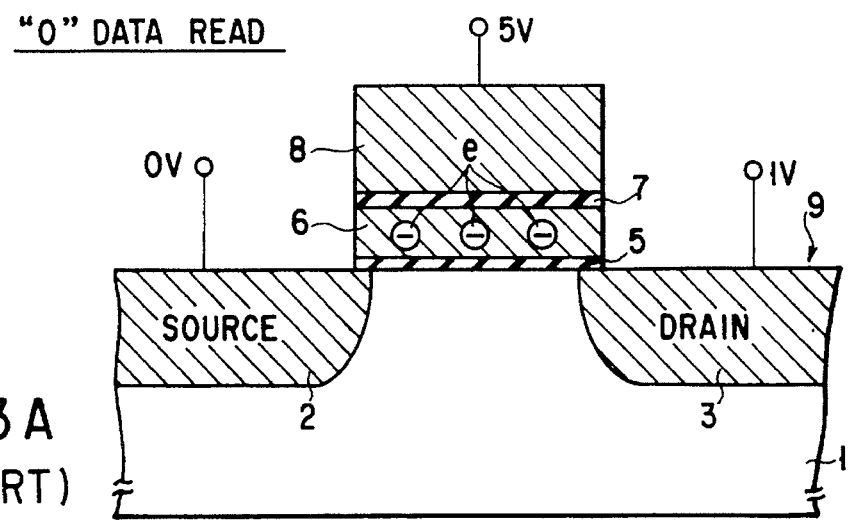
FIGS. 3A and 3B are cross sectional views for illustrating the readout operation of the memory cell shown in FIG. 1.
Figure 3B:
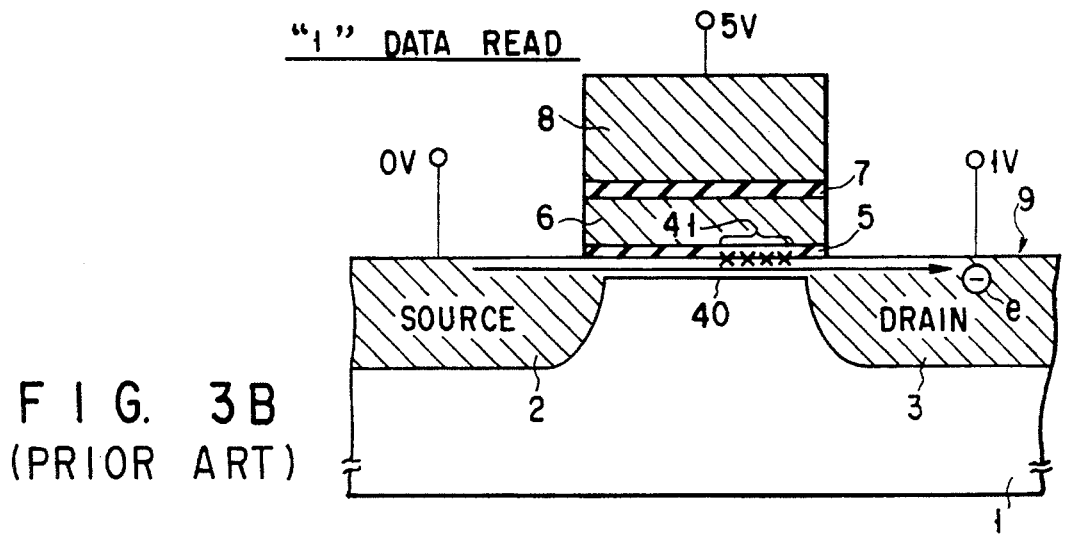

There will now be described an embodiment of this invention with reference to the accompanying drawings. In this explanation, portions which are the same throughout the entire drawings are denoted by the same reference numerals and the repetitive explanation therefor is omitted.

Figure 4:
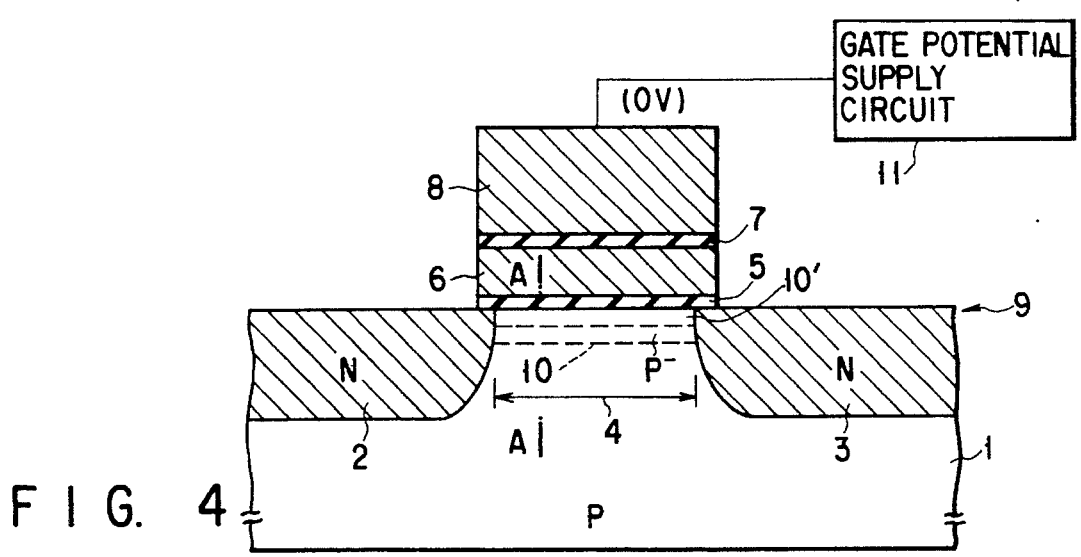
FIG. 4 is a cross sectional view showing a memory cell of a non-volatile semiconductor memory device according to a first embodiment of this invention.
Figure 5:
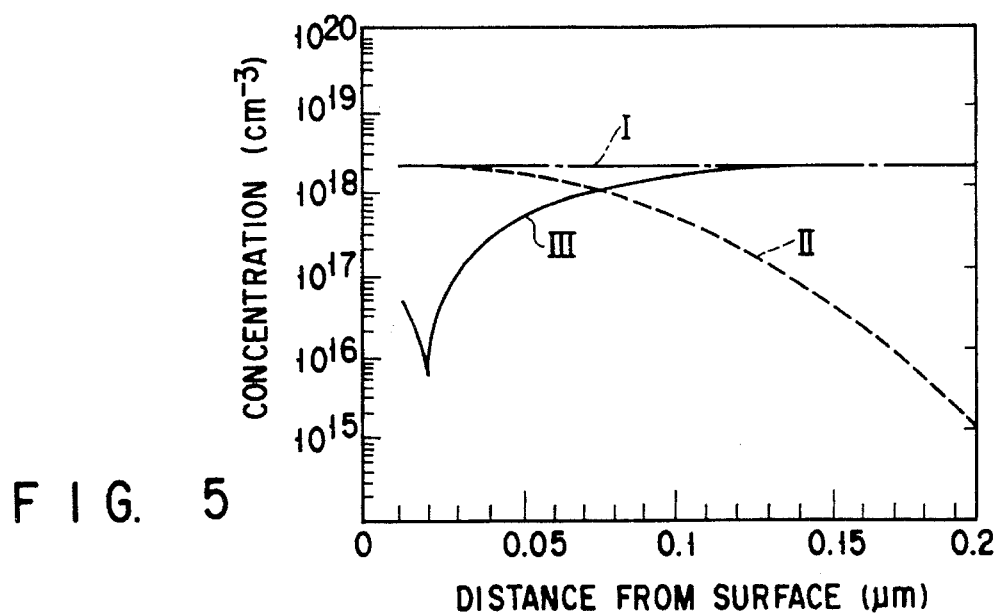
FIG. 5 is a diagram showing the impurity profile along the A—A line in FIG. 4.

FIG. 4 is a cross sectional view showing a memory cell of a non-volatile semiconductor memory device according to a first embodiment of this invention, and FIG. 5 is a diagram showing the impurity profile along the A—A line in FIG. 4.

As shown in FIG. 4, a P-type silicon substrate 1 containing boron (B) of approximately $10^{18}$ $cm^{-3}$ is used and an N-type source diffused layer 2 and an N-type drain diffused layer 3 are separately formed in the substrate 1. A P-type channel region 4 having a two-layered structure including a P-type surface channel layer 10' and a P⁻-type buried channel layer 10 is formed in a portion of the P-type substrate 1 which lies between the diffused layers 2 and 3.

A first gate insulation film 5 of silicon dioxide is formed on the channel region 4 and a floating gate 6 of polysilicon is formed on the first gate insulation film 5. A second gate insulation film 7 of silicon dioxide is formed on the floating gate 6 and a control gate 8 of polysilicon is formed on the second gate insulation film 7. The control gate 8 is connected to a gate potential supplying circuit 11 for supplying a readout potential (VCC, for example, 5 V) at the time of data readout and supplying a programming potential (VPP, for example, 12 V) at the time of data writing.

Further, in a deep portion of the channel region 4 which is far apart from the substrate surface 9, the $P^-$-type buried channel layer 10 whose acceptor concentration is made lower than the channel region 4 is formed. The impurity profile of the channel region 4 including the $P^-$-type buried channel layer 10 is shown in FIG. 5.

As shown in FIG. 5, the channel region 4 contains boron (B) of approximately $10^{18}$ cm$^{-3}$ as indicated by one-dot-dash lines I and is formed of P-type conductivity. Further, as indicated by broken lines II, arsenic (As) which is an N-type impurity is doped into the channel region 4. By doping the N-type impurity into the P-type region, the effective acceptor concentration can be lowered. In this embodiment, as indicated by the solid line III, the effective acceptor concentration is set to the minimum value in position at a distance of 0.02 μm from the substrate surface 9. By lowering the effective acceptor concentration, it becomes possible to partially form the $P^-$-type buried channel layer 10 in a deep region apart from the substrate surface 9.

In the memory cell with the above structure, the channel region 4 is of the P-type conductivity and when a potential difference between the substrate 1 and the control gate 8 is substantially 0 V, the source diffused layer 2 and the drain diffused layer 3 are isolated from each other by the PN junction. That is, a normally OFF type memory cell is obtained. Such a memory cell can be used in a NOR type flash $E^2$PROM, for example.

Next, the data readout operation, data writing operation and data erasing operation of the memory cell shown in FIG. 4 are explained.

First, the data readout operation is explained.

Figure 6A:
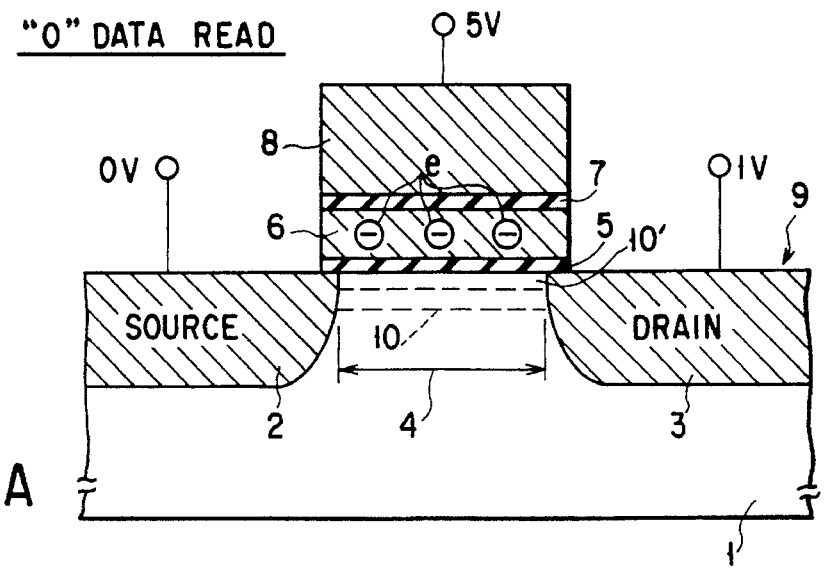
FIGS. 6A and 6B are cross sectional views for illustrating the readout operation of the memory cell shown in FIG. 4.
Figure 6B:
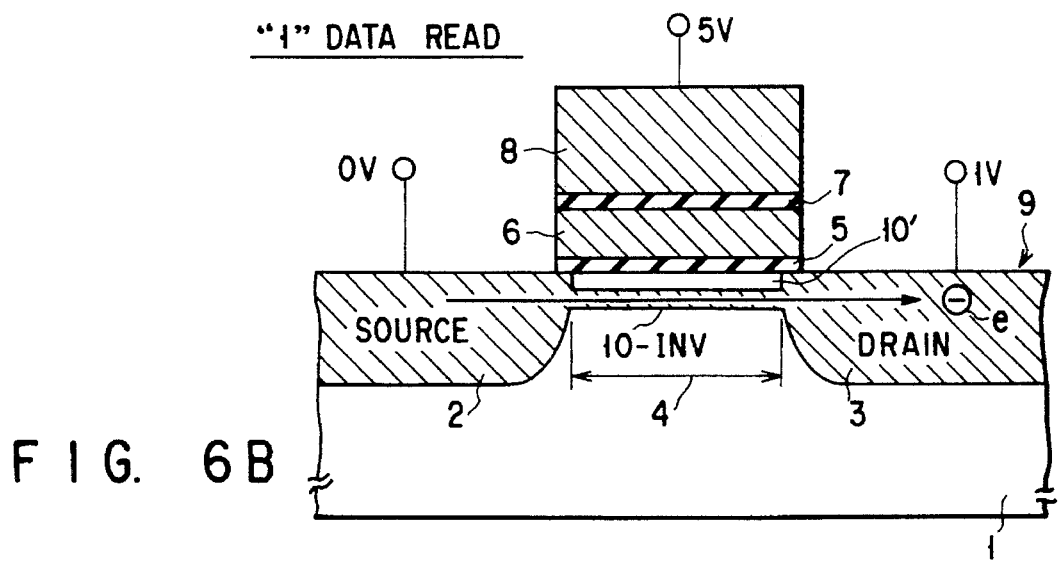

FIG. 6A is a cross sectional view for illustrating the readout operation at the time of reading data of "0" level and FIG. 6B is a cross sectional view for illustrating the readout operation at the time of reading data of "1" level.

At the time of reading out data, a readout potential of 1 V is applied to the drain of the memory cell and a readout potential of 5 V (VCC) is applied to the control gate 8 with the source 2 of the memory cell kept at the ground potential (0 V).

First, the readout operation in a case wherein electrons e are injected into the floating gate 6 and the floating gate is sufficiently negatively charged (stored data is "0" level) is explained.

As shown in FIG. 6A, when a large amount of electrons e are present in the floating gate 8 and the floating gate is sufficiently negatively charged, a potential difference between the substrate 1 and the control gate 8 is substantially canceled by the capacitive coupling even if the readout potential of 5 V is applied to the control gate 8. For this reason, the conductivity type of the channel region 4 including the buried channel layer 10 is not inverted. Therefore, the memory cell is not made conductive and no current flows in a portion between the source 2 and the drain 3. As a result, the potential of a bit line (not shown) connected to the drain 3 is not changed.

On the other hand, if the readout potential of 5 V is applied to the control gate 8 when only a small amount of electrons e are present in the floating gate 8 and the floating gate is not substantially charged as shown in FIG. 6B, a potential difference is caused between the substrate 1 and the control gate 8 by the capacitive coupling. At this time, the conductivity type of only the buried channel region 10 contained in the channel region 4 is inverted to form an inverted layer 10-INV. Since the inverted layer 10-INV connects the source diffused layer 2 and the drain diffused layer 3 to each other, the memory cell is made conductive. If the memory cell is made conductive, a cell current flows in a portion between the source 2 and the drain 3. Then, the potential of a bit line (not shown) connected to the drain 3 is changed. In FIG. 6B, the traveling direction of the electrons e is shown. The flowing direction of the cell current is opposite to the traveling direction of the electrons 2. Further, the drain potential lowered by the flow of cell current is compared with a reference potential and amplified by a sense amplifier (not shown).

In the memory cell of this embodiment, the $P^-$-type buried channel layer 10 whose concentration is lowered is formed in the deeper portion of the channel region 4. The concentration thereof is set to such a value that the conductivity type thereof may be inverted when the readout potential of 5 V is applied to the control gate 8 in a case wherein "1" level data is stored. Therefore, the cell current flows in the inverted layer 10-INV formed by inverting the conductivity type of the $P^-$-type buried channel layer 10. That is, the cell current flows not in a portion near the substrate surface 9 but inside the deep portion of the channel region 4. Therefore, the cell current is not influenced by the interface state between the substrate 1 and the first gate insulation film 5. For this reason, even if the interface state is increased by repeatedly effecting the writing/erasing operations, the mutual conductance of the above memory cell can be prevented from being easily deteriorated. That is, in the above memory cell, it is possible to cause the cell current to stably and easily flow for a long period of time. Therefore, the readout operation can be stably effected for a long period of time.

Next, the data writing operation is explained.

Figure 7:
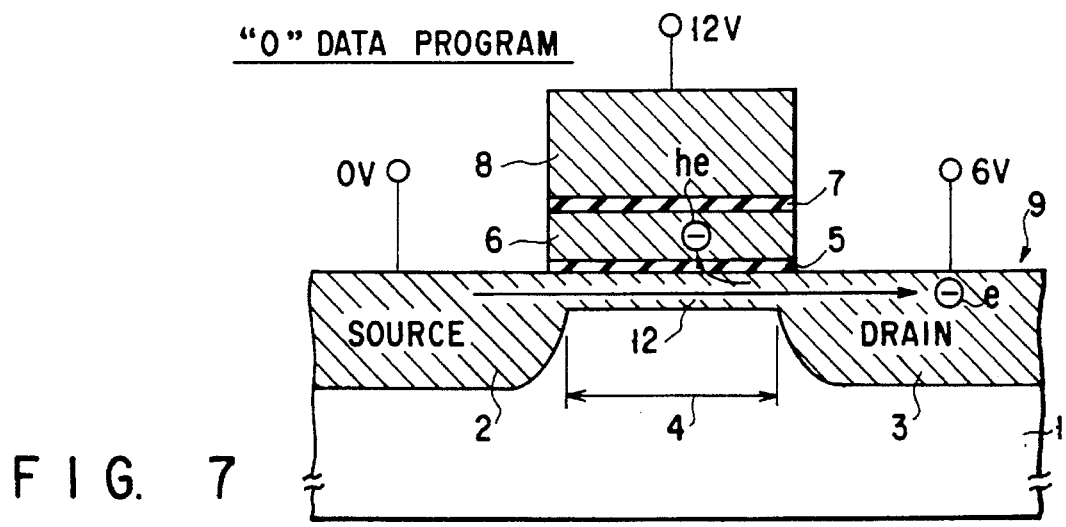
FIG. 7 is a cross sectional view for illustrating the writing operation of the memory cell shown in FIG. 4.

FIG. 7 is a cross sectional view of the memory cell when electrons are injected into the floating gate.

In order to write data, a potential of 6 V is applied to the drain 3 and a programming potential of 12 V (VPP) is applied to the control gate 8 with the source 2 of the memory cell kept at the ground potential (0 V).

In the above bias state, a sufficiently large potential difference occurs between the drain 3 and the source 2 as shown in FIG. 7. Therefore, some of the electrons e traveling from the source 2 to the drain 3 are sufficiently accelerated by the large potential difference to obtain large energy so as to generate channel hot electrons he. Further, since the control gate 8 is set to the programming potential of 12 V, hot electrons he get over the barrier formed by the first gate insulation film 5 and injected into the floating gate 6. As a result, "0" level data is written into the memory cell.

In this case, as shown in FIG. 4, the control gate 8 is connected to the gate potential supplying circuit 11. The supplying circuit 11 supplies a potential for inverting not only the conductivity type of the $P^-$-type buried channel layer 10 but also the conductivity type of the P-type surface channel layer 10' formed between the $P^-$-type buried channel layer 10 and the substrate surface 9. As a result, a sufficiently large inverted layer 12 which includes the surface channel layer 10' and buried channel layer 10 and in which the conductivity type of the substrate surface 9 is also inverted is obtained in the channel region 4. The inverted layer 12 is significantly larger than the inverted layer 10-INV formed at the time of readout operation. Further, the inverted layer 12 extends to the deep portion of the substrate 1. Therefore, it becomes possible to generate hot electrons in the deep portion of the channel region 4.

The mobility of carriers is higher in the deep portion of the channel region 4 than in a portion near the surface 9 of the substrate 1. For example, this is because the mobility of carriers is lowered by an influence of crystal defects occurring at the time of thermal oxidation or etching in a portion near the surface 9 of the substrate 1 but less crystal defects occur in the deep portion of the substrate 1 and the mobility of carriers is not easily lowered. If the mobility of carriers becomes high, the generation efficiency of hot electrons he is enhanced.

Next the relation between the control gate voltage and the gate current at the time of writing is explained.

Figure 9:
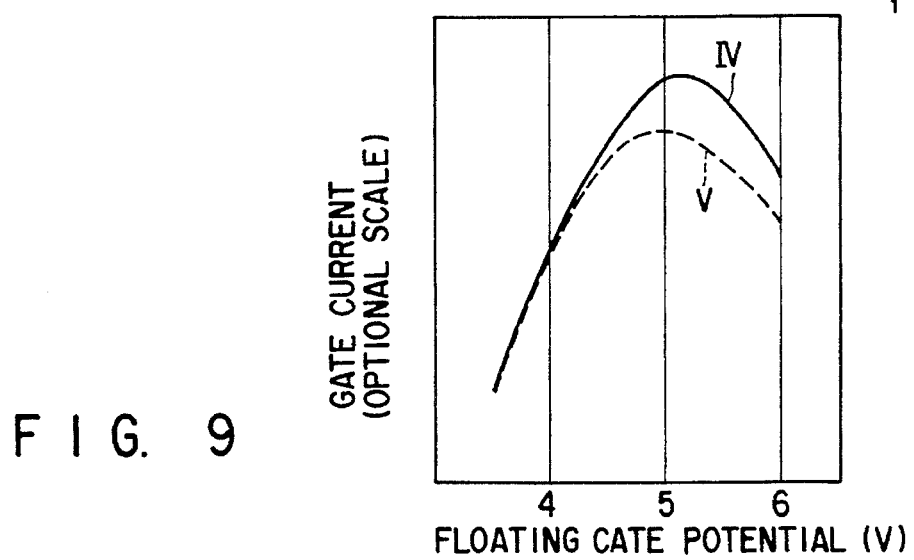
FIG. 9 is a diagram showing the relation between the potential of the floating gate and the gate current.

FIG. 9 is a diagram showing the relation between the control gate voltage and the gate current at the time of writing in the memory cell shown in FIG. 4 in comparison with that in the conventional memory cell shown in FIG. 1.

In FIG. 9, the solid line IV indicates a case of the device of this embodiment and the broken lines V indicate a case of the conventional device.

As shown in FIG. 9, in the device of this embodiment, the gate current is larger than in the case of the conventional device and the carrier injection efficiency is enhanced. The gate current is assumed as a current apparently flowing from the floating gate 6 to the channel region 4 when electrons are injected into the floating gate 6 and is not a tunnel current based on the F-N tunneling phenomenon.

FIG. 9 is a diagram for indicating the tendency of the gate current to increase.

When electrons e are gradually filled into the floating gate 6 by effecting the data writing operation, the potential vfg of the floating gate 6 is gradually shifted in the negative direction according to the amount of the electrons. Therefore, it is considered that a potential difference between the control gate and the channel region 4 is reduced by the capacitive coupling even if the potential Vcg of the control gate 8 is high. For this reason, there occurs a possibility that the conductivity type of the surface channel layer 10' among the inverted layer 12 will be returned to the original P-type. If such a phenomenon occurs, the writing efficiency may be markedly lowered.

Therefore, in this embodiment, the supplying circuit 11 is designed to generate a potential which can invert the conductivity type of the surface channel layer 10' even when electrons e are fully filled into the floating gate 6.

Figure 10:
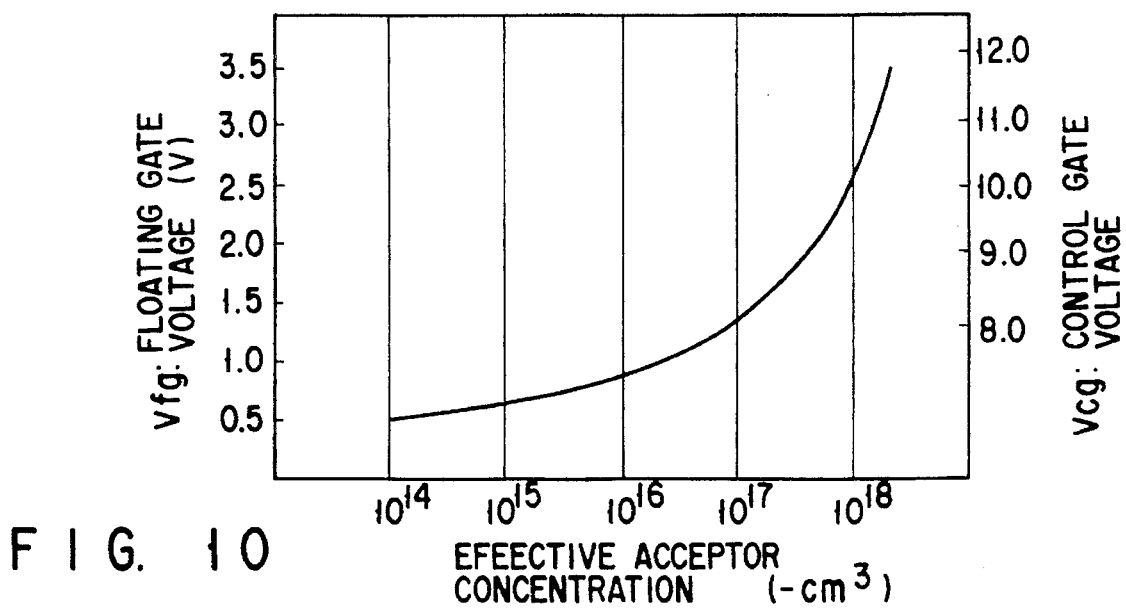
FIG. 10 is a diagram showing the relation between the effective acceptor concentration and the control gate voltage and the relation between the effective acceptor concentration and the floating gate voltage.

FIG. 10 is a diagram showing the relation between the effective acceptor concentration in the surface channel layer 10' and a potential which can invert the conductivity type thereof.

In FIG. 10, Vfg on the ordinate indicates a voltage of the floating gate which is a voltage corresponding to the threshold voltage of a normal MOSFET. Vcg on the ordinate indicates a voltage of the control gate which is a voltage applied to the control gate at the time of writing operation. The abscissa indicates the effective acceptor concentration of the surface channel layer 10'.

As shown in FIG. 10, if the effective acceptor concentration of the surface channel layer 10' is equal to or less than approximately $10^{17}$ cm$^{-3}$ when the control gate voltage Vcg is 8 V, the conductivity type thereof is inverted. Likewise, if the effective acceptor concentration of the surface channel layer 10' is equal to or less than approximately $10^{18}$ cm$^{-3}$ when the control gate voltage Vcg is 10 V, the conductivity type thereof is inverted.

Next, the data erasing operation is explained.

Figure 8:
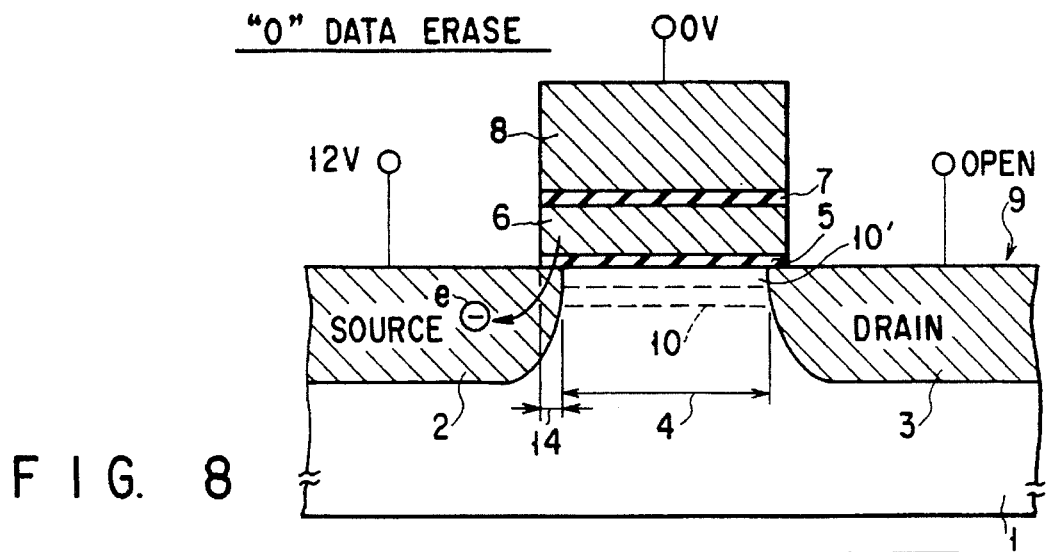
FIG. 8 is a cross sectional view for illustrating the erasing operation of the memory cell shown in FIG. 4.

FIG. 8 is a cross sectional view for illustrating the erasing operation in a case wherein electrons are extracted from the floating gate.

when data is erased, an erasing potential of 12 V is applied to the source 2 with the drain 3 of the memory cell kept open and the control gate 8 set at the ground potential (0 V).

When the above bias state is set, a sufficiently intense electric field is generated in an overlap area 14 in which the source 2 and the floating gate 6 overlap each other as shown in FIG. 8 and an F-N tunnel current flows from the source 2 towards the floating gate 6 in the area 14. As a result, electrons e stored in the floating gate 6 are discharged to the source 2 so that "0" level data will be erased in the memory cell.

Next, a non-volatile semiconductor memory device according to a second embodiment of this invention is explained.

FIG. 11 is a cross sectional view showing a memory cell of a non-volatile semiconductor memory device according to the second embodiment of this invention.

As shown in FIG. 11, in the device according to the second embodiment, a P$^+$-type region 15 having higher boron concentration than a substrate 1 is formed in a channel region 4 and a P$^+$-type buried channel layer 10 having boron concentration made lower than than the region 15 is partially formed in the P$^+$-type region 15. With this structure, the P$^+$-type region 15 is provided between the buried channel layer 10 and the bulk of the substrate 1.

Like the memory cell shown in FIG. 4, in the memory cell with the above structure, the readout operation can be correctly effected for a long period of time and the data writing speed can be enhanced.

In the memory cell shown in FIG. 11, it is possible to prevent occurrence of the punch through phenomenon that a depletion layer occurring in the PN junction area between the drain 3 and the substrate 1 is formed in contact with the source 2 to make the memory cell conductive in a state in which both of the source 2 and the control gate 8 are grounded and only the drain 3 is applied with a high potential. This is because extension of the depletion layer can be suppressed in the P$^+$-type region 15 having higher boron concentration than the substrate 1 by forming the P$^+$-type region 15 in the channel region 4.

The bias state in which the high potential is applied only to the drain occurs in the memory cell in the non-selected state at the time of data writing operation, for example. One example of the high potential state in which only the drain potential is high is that both of the potentials of the source 2 and the control gate 8 are 0 V and the potential of the drain is 6 V.

Further, since the operation of the memory cell shown in FIG. 11 is substantially the same as that of the memory cell shown in FIG. 4, the explanation for the operation is omitted.

Next, a method for forming the memory cell shown in FIG. 11 is explained.

FIGS. 12A to 12D are cross sectional views of the memory cell of FIG. 4 showing the main manufacturing steps.

First, as shown in FIG. 12A, a field oxide film (not shown) or the like is formed in the surface area of the P-type silicon substrate 1 to define an element region on the surface of the substrate 1. Then, photoresist is coated on the substrate 1 to form a resist layer 16. Next, a window 17 corresponding to the channel region 4 of the memory cell is formed in the resist layer 16 by the photo etching method. Then, boron is ion-implanted into the channel region 4 of the substrate 1 via the window 17 in a condition that the acceleration voltage is 60 keV and the dose amount is of the order of $10^{12}$ cm$^{-2}$ to $10^{13}$ cm$^{-2}$. By this process, the acceptor concentration in the channel region 4 is increased to form a P$^+$-type 15 having higher concentration than the substrate 1 in the channel region 4.

Next, as shown in FIG. 12B, arsenic is ion-implanted into the channel region 4 via the window 17 in a condition that the acceleration voltage is 45 keV and the dose amount is approximately $10^{14}$ cm$^{-2}$. By this process, the acceptor concentration is partially lowered in a deep portion of the channel region 4 and a P$^-$-type region 10 whose impurity concentration is apparently lowered than the substrate 1 and the P$^-$-type region 15 can be obtained.

Next, as shown in FIG. 12C, a first gate insulation film 5, floating gate 6, second insulation film 7 and control gate 8 are sequentially formed on the channel region 4. These films and gates may be formed by the known forming method.

Next, as shown in FIG. 12D, arsenic is ion-implanted into the substrate 1 with the control gate 8 and a field oxide film (not shown) used as a mask. Then, by effecting the annealing process for activating ion-implanted impurities, an N-type diffused layer 2 acting as the source of the memory cell and an N-type diffused layer 3 acting as the drain are formed in contact with the P$^-$-type region 10.

When the memory cell shown in FIG. 4 is formed, the step shown in FIG. 12A may be omitted, for example.

Next, a non-volatile semiconductor memory device according to a third embodiment of this invention is explained.

Figure 13:
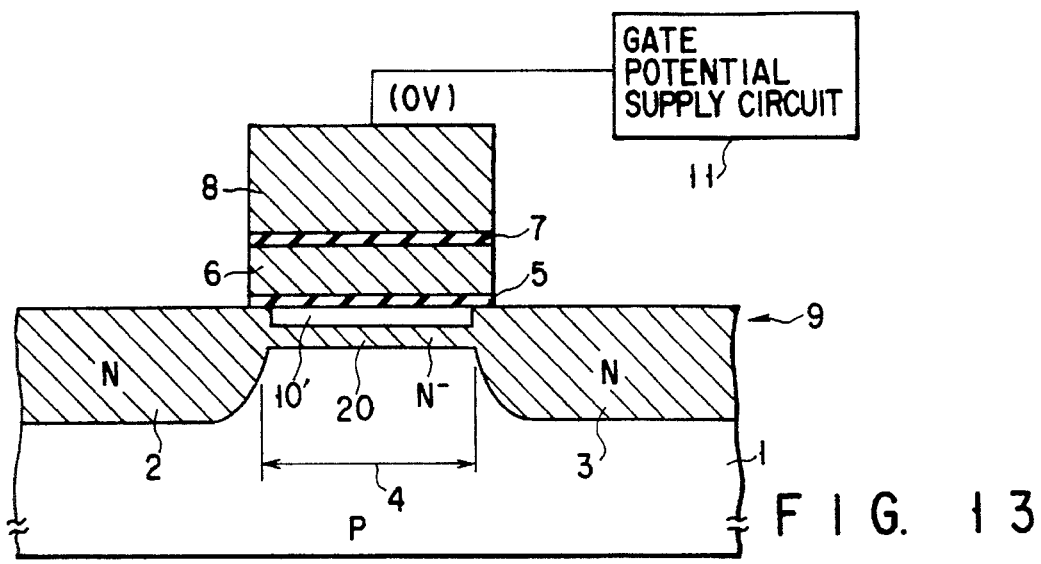
FIG. 13 is a cross sectional view showing a memory cell of a non-volatile semiconductor memory device according to a third embodiment of this invention.

FIG. 13 is a cross sectional view showing a memory cell of a non-volatile semiconductor memory device according to the third embodiment of this invention.

As shown in FIG. 13, in the device according to the third embodiment, an N$^-$-type region 20 which is connected to an N-type source diffused layer 2 and an N-type drain diffused layer 3 is partially formed in a deep portion at a distance from the substrate surface 9. The conductivity type of the buried channel 20 is an N-type opposite to that of the substrate 1 when a potential difference between the substrate 1 and the control gate 8 is substantially 0 V. That is, the device is a normally ON type memory cell. Such a memory cell can be used in a NAND type flash E$^2$PROM or NOR type flash E$^2$PROM of a type having a selection transistor connected between the drain of the memory cell and a bit line, for example.

Next, the data readout operation, data writing operation and data erasing operation of the memory cell shown in FIG. 13 are explained.

First, the data readout operation is explained.

Figure 14A:
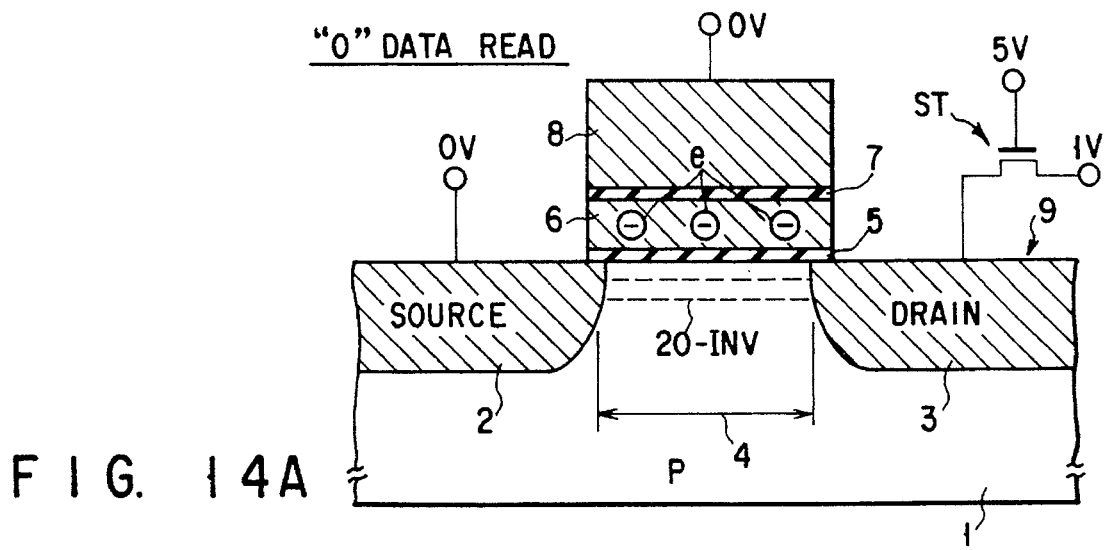
FIGS. 14A and 14B are cross sectional views for illustrating the readout operation of the memory cell shown in FIG. 13.
Figure 14B:
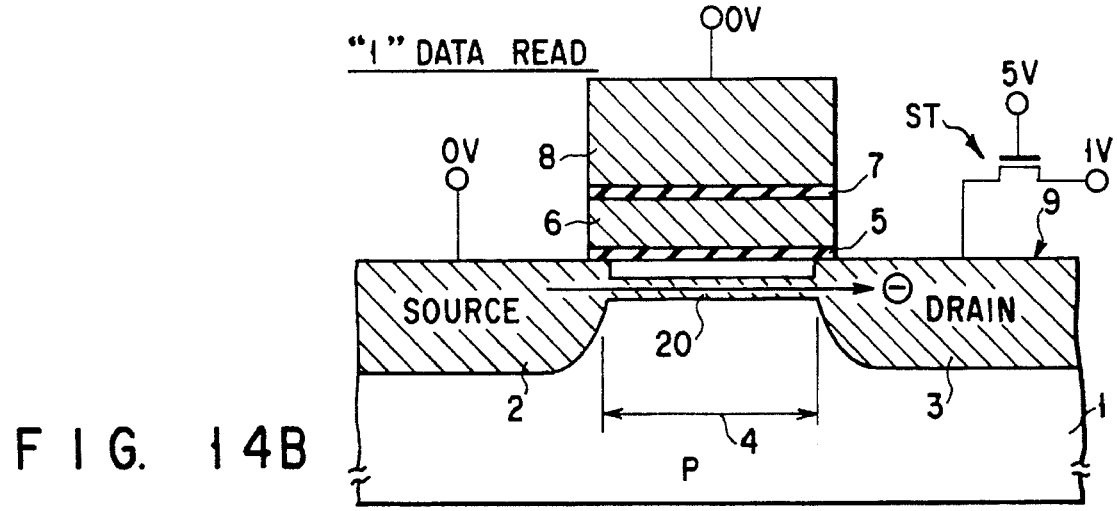

FIG. 14A is a cross sectional view for illustrating the operation of reading out "0" level data, and FIG. 14B is a cross sectional view for illustrating the operation of reading out "1" level data.

For data readout, a readout potential of 1 V is applied to the drain 3 via the selection transistor ST with the source 2 of the memory cell set at the ground potential (0 V). In this case, the control gate 8 is set at the ground potential (0 V, VSS). The row selection is effected by use of the selection transistor ST. The gate of the selected selection transistor ST is applied with a readout potential 5 V.

As shown in FIG. 14A, since the floating gate 6 of the N$^-$-type buried channel layer 20 is negatively charged when "0" level data is read out, the conductivity type thereof is inverted to form an inverted layer 20-INV. Therefore, the memory cell is not made conductive and no cell current flows between the source 2 and the drain 3. As a result, the potential of a bit line (not shown) connected to the drain 3 is not changed.

On the other hand, as shown in FIG. 14B, since the floating gate 6 of the N$^-$-type buried channel layer 20 is not substantially charged when "1" level data is read out, the conductivity type thereof is not inverted. Therefore, the source diffused layer 2 and the drain diffused layer 3 are connected to each other via the N$^-$-type buried channel layer 20. Therefore, the memory cell is made conductive and a cell current flows between the source 2 and the drain 3. As a result, the potential of a bit line (not shown) connected to the drain 3 via the selection transistor ST is changed.

Next, the data writing operation is explained.

Figure 15:
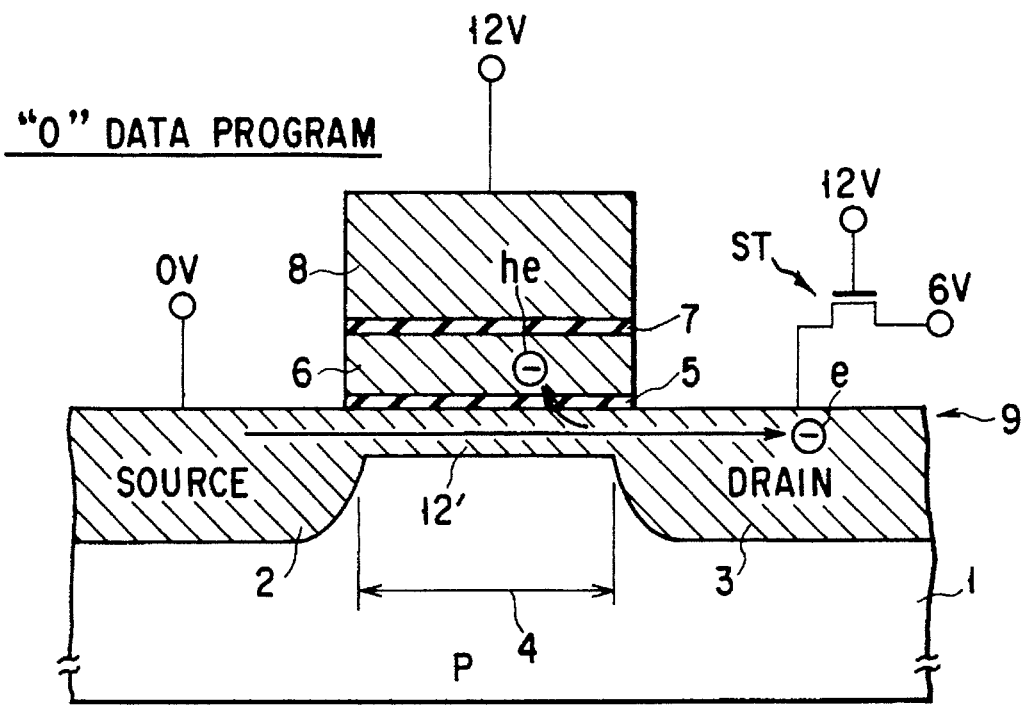
FIG. 15 is a cross sectional view for illustrating the writing operation of the memory cell shown in FIG. 13.

FIG. 15 is a cross sectional view of the memory cell when electrons are injected into the floating gate thereof.

In order to write data, a potential of 6 V is applied to the drain 3 via the selection transistor ST and a programming potential of 12 V (VPP) is applied to the control gate 8 with the source 2 of the memory cell kept at the ground potential (0 V).

In the above bias state, as shown in FIG. 15, the conductivity type of the surface channel layer 10' is inverted from P-type to N-type and an inverted layer is newly formed. Thus, a large N-type layer 12' including the inverted layer and the N$^-$-type buried channel layer 20 and reaching the substrate surface 9 is obtained.

Next, the data erasing operation is explained.

Figure 16:
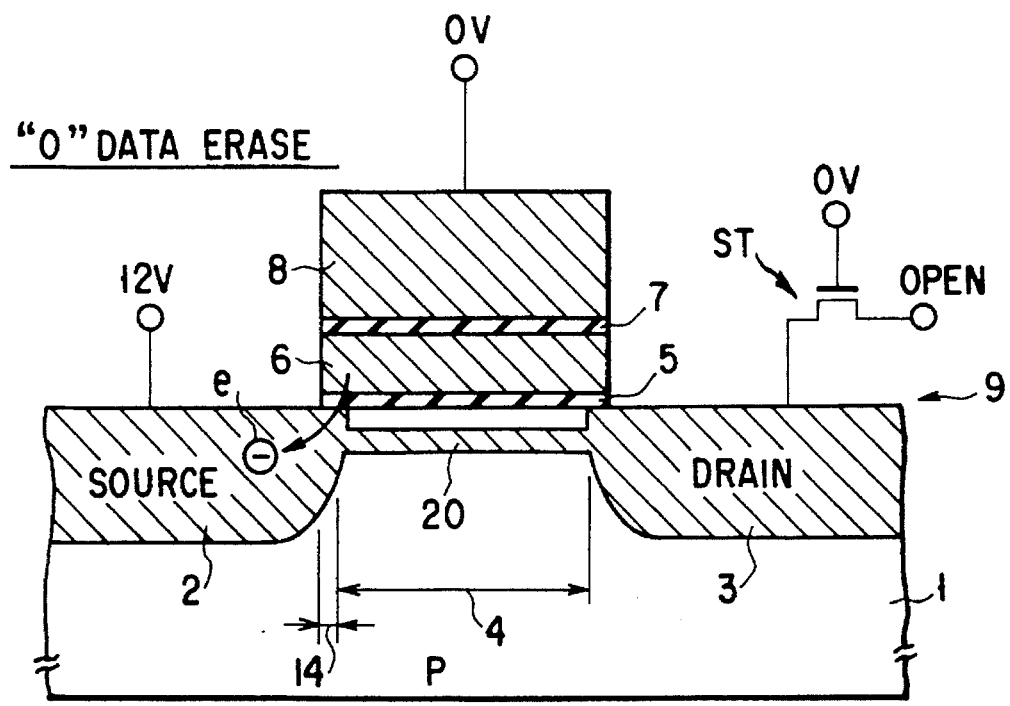
FIG. 16 is a cross sectional view for illustrating the erasing operation of the memory cell shown in FIG. 13.

FIG. 16 is a cross sectional view for illustrating the erasing operation in a case wherein electrons are extracted from the floating gate.

When data is erased, an erasing potential of 12 V is applied to the source 2 with the drain 3 of the memory cell kept open and the control gate 8 set at the ground potential (0 V).

When the above bias state is set, a sufficiently intense electric field is generated in an overlap area 14 in which the source 2 and the floating gate 6 overlap each other as shown in FIG. 16 and an F-N tunnel current flows from the source 2 towards the floating gate 6 in the area 14. As a result, electrons e stored in the floating gate 6 are discharged to the source 2 so that data will be erased in the memory cell.

Also, in the memory cell shown in FIG. 13, only the N$^-$-type buried channel layer 20 is used when reading out data and data of "1" level or "0" level is determined according to whether the conductivity type of the buried channel layer 20 is set to the same conductivity type as that of the substrate 1 or not. Therefore, since a cell current flows only in the buried channel layer 20 separated from the substrate surface 9, the loss of the cell current can be suppressed as in the case of the first embodiment.

Further, when data is written, a current flows in the N$^-$-type buried channel layer 20 lying in the deep portion of the substrate 1 so that generation efficiency of hot electrons will be raised like the first embodiment. An inverted layer is formed by inverting the conductivity type of the surface channel layer 10', a large N-type layer 12' is formed of the inverted layer and the N$^-$-type buried channel layer 20, and a current is caused to flow in the large N-type layer. Thus, like the first embodiment, a region in which a current flows is formed near the gate insulation film, thereby enhancing the carrier injection efficiency. Further, the channel resistance can be reduced.

Next, a non-volatile semiconductor memory device according to a fourth embodiment of this invention is explained.

Figure 17:
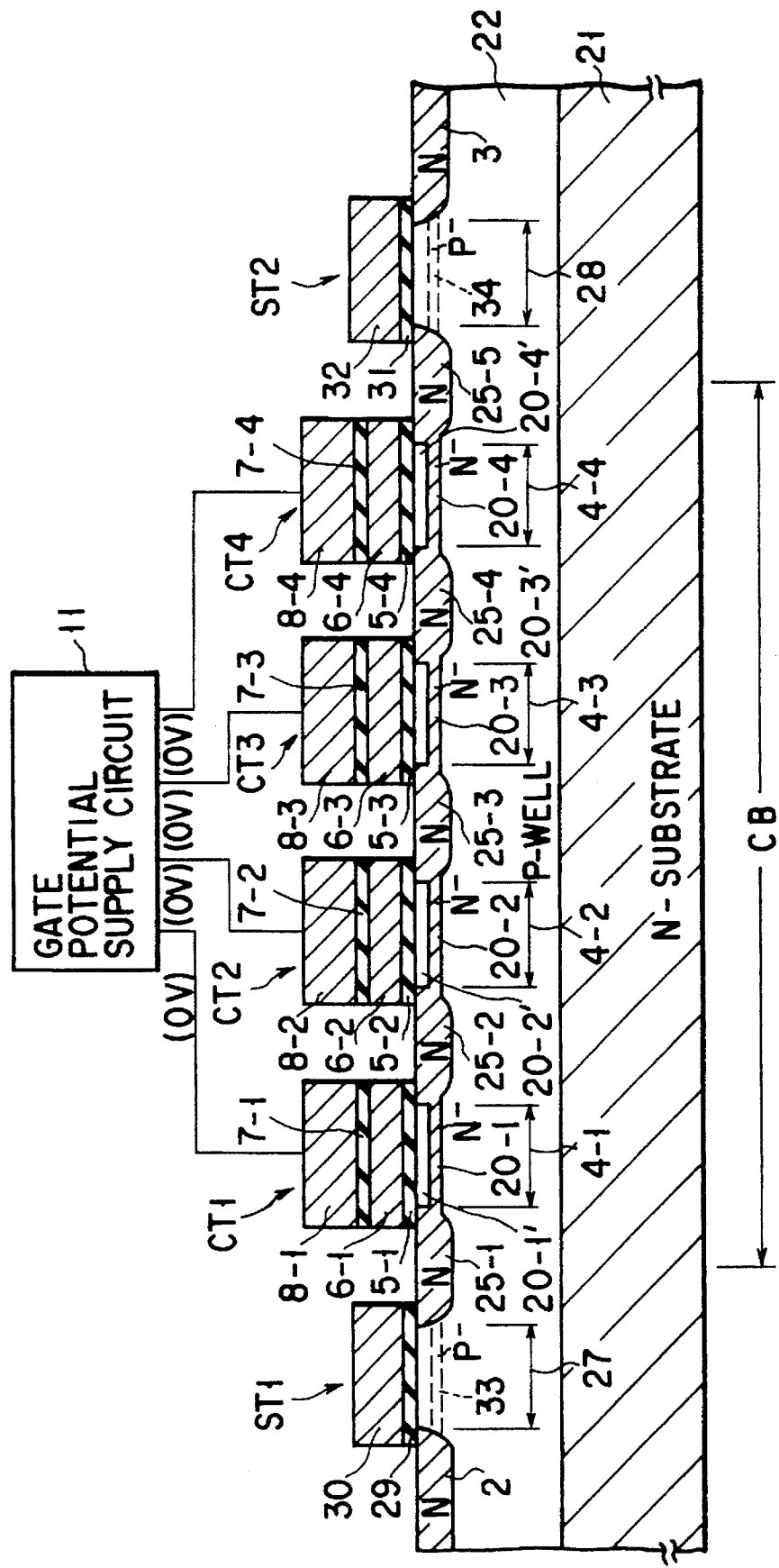
FIG. 17 is a cross sectional view showing a memory cell of a non-volatile semiconductor memory device according to a fourth embodiment of this invention.

FIG. 17 is a cross sectional view showing a memory cell of a non-volatile semiconductor memory device according to the fourth embodiment of this invention.

This embodiment is an example in which the memory cell explained with reference to FIG. 13 is applied to a NAND type flash $E^2PROM$.

In FIG. 17, the cross section of a cell of the NAND type flash $E^2PROM$ is shown.

As shown in FIG. 17, a P-type well region 22 is formed in an N-type silicon substrate 21. A cell block CB is defined in the P-type well region 22. The cell block CB includes a plurality of series-connected cell transistors CT1 to CT4. It is supposed in this embodiment that four cell transistors are provided in one block and one block is constructed by four rows. The number of rows in one block is not limited to four and can be set to a desired number, for example, eight according to the specification of the device.

One end (source) of the current path of the cell block CB is connected to one end (drain) of the current path of the first selection transistor ST1. The other end (drain) of the current path of the cell block CB is connected to one end (source) of the current path of the second selection transistor ST2. The other end (source) of the current path of the first selection transistor ST1 is connected to a low potential node (for example, ground terminal) and the other end (drain) of the current path of the second selection transistor ST2 is connected to a bit line (not shown).

In the P-type well region 22, an N-type diffused layer 2, N-type diffused layer 3, and N-type diffused layers 25-1 to 25-5 are separately formed. A portion of the P-type well region 22 which lies between the diffused layers 25-1 and 25-2 acts as a channel region 4-1 of the cell transistor CT1. Likewise, a portion of the P-type well region 22 which lies between the diffused layers 25-2 and 25-3 acts as a channel region 4-2 of the cell transistor CT2, a portion of the P-type well region 22 which lies between the diffused layers 25-3 and 25-4 acts as a channel region 4-3 of the cell transistor CT3, and a portion of the P-type well region 22 which lies between the diffused layers 25-4 and 25-5 acts as a channel region 4-4 of the cell transistor CT4.

Further, a portion of the P-type well region 22 which lies between the diffused layers 2 and 25-1 acts as a channel region 27 of the first selection transistor ST1 and a portion of the P-type well region 22 which lies between the diffused layers 3 and 25-5 acts as a channel region 28 of the second selection transistor ST2.

A first gate insulation film 5-1 of silicon dioxide is formed on the channel region 4-1 and a floating gate 6-1 of polysilicon is formed on the first gate insulation film 5-1. A second gate insulation film 7-1 of silicon dioxide is formed on the floating gate 6-1 and a control gate 8-1 of polysilicon is formed on the second gate insulation film 7-1. The cell transistor CT1 has the above stacked gate structure. Also, each of the cell transistors CT2 to CT4 has the same stacked gate structure as that of the first cell transistor CT1.

A gate insulation film 29 of silicon dioxide is formed on the channel region 27 and a selection gate 30 of polysilicon is formed on the gate insulation film 29. The first selection transistor ST1 has the above gate structure. Likewise, a gate insulation film 31 of silicon dioxide is formed on the channel region 28 and a selection gate 32 of polysilicon is formed on the gate insulation film 31. The second selection transistor ST2 has the above gate structure.

An $N^-$-type buried channel layer 20-1 as is explained with reference to FIG. 13 is formed in a deep portion at a distance from the surface of the channel region 4-1 to connect the diffused layer 25-1 and the diffused layer 25-2 to each other. Thus, the cell transistor CT1 acts as a normally ON type transistor. Likewise, $N^-$-type buried channel layers 20-2 to 20-4 are respectively formed in the channel regions 4-2 to 4-4 and each of the cell transistors CT2 to CT4 acts as a normally ON type transistor.

Further, an $P^-$-type buried channel layer 33 which is similar to the $P^-$-type buried channel layer 10 as is explained with reference to FIG. 4 is formed in a deep portion at a distance from the surface of the channel region 27, and a $P^-$-type buried channel layer 34 which is similar to the $P^-$-type buried channel layer 10 is formed in the channel region 28. Thus, the selection transistors ST1, ST2 act as normally OFF type transistors, and when the selection transistors are turned on, an inverted layer is formed in a deep portion at a distance from the surface of the well region.

Next, the data readout operation, data writing operation and data erasing operation of the NAND type memory cell group shown in FIG. 17 are explained.

First, the data readout operation is explained.

Figure 18A:
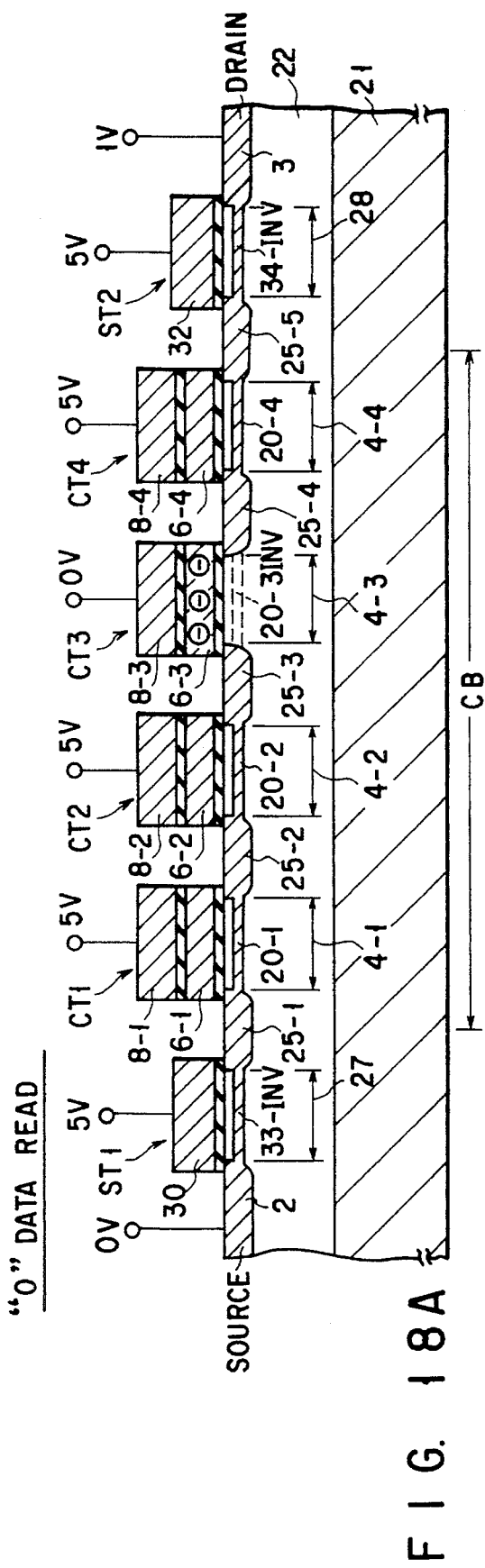
FIGS. 18A and 18B are cross sectional views for illustrating the readout operation of the memory cell shown in FIG. 17.
Figure 18B:
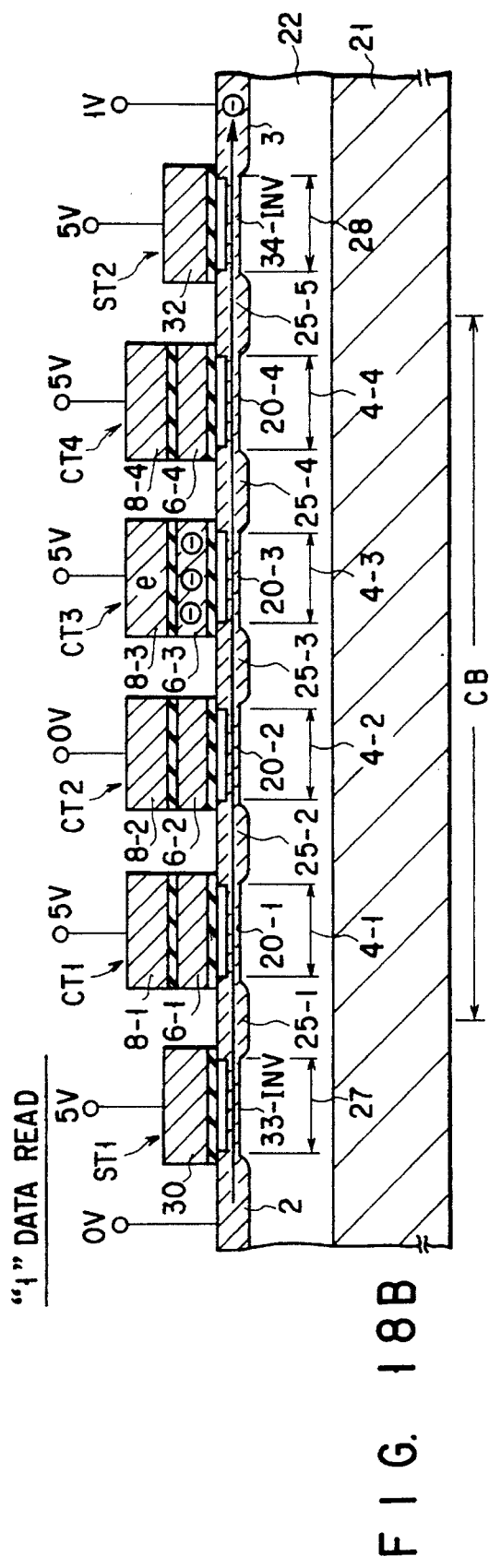

FIG. 18A is a cross sectional view for illustrating the operation of reading out "0" level data, and FIG. 18B is a cross sectional view for illustrating the operation of reading out "1" level data.

For data readout, a VCC potential of 5 V is applied to the gate 30 of the first selection transistor ST1 and the gate 32 of the second selection transistor ST2. As a result, the conductivity types of the $P^-$-type buried channel layers 33 and 34 are inverted to form inverted layers 33-INV and 34-INV. Since the inverted layer 33-INV electrically connects the source diffused layer 2 and the diffused layer 25-1 to each other and the inverted layer 34-INV electrically connects the drain diffused layer 3 and the diffused layer 25-5 to each other, the transistors ST1 and ST2 are both made conductive. In this condition, the source 2 of the cell block CB is set at the ground potential (0 V) and the drain 3 is applied with a readout potential of 1 V.

As shown in FIG. 18A, a large amount of electrons e are present in the floating gate 6-3 of the cell transistor CT3, for example. At this time, in order to select the cell transistor CT3 from the cell block CB, a selection readout potential of 0 V (VSS) is applied to the control gate 8-3 and a readout conduction potential of 5 V (VCC) is applied to the other control gates 8-1, 8-2 and 8-3. In this case, since the floating gate 6-3 is negatively charged, the conductivity type of the $N^-$-type buried channel layer 20-3 is inverted to form an inverted layer 20-3INV. Therefore, the cell transistor CT3 is not made conductive and no cell current flows between the source 2 and the drain 3. As a result, the potential of a bit line (not shown) connected to the drain 3 is not changed.

On the other hand, as shown in FIG. 18B, since substantially no electrons e are present in the floating gate 6-2 when a selection readout potential of 0 V (VSS) is applied to the control gate 8-2 and the cell transistor CT2 is selected from the cell block CB, the $N^-$-type buried channel layer 20-2 is kept formed. Therefore, the cell transistor CT2 is made conductive. At this time, a large amount of electrons e are present in the floating gate 6-3 of the cell transistor CT3. However, the concentrations of the N⁻-type regions 20-1 to 20-4 are so determined as to set them to the N⁻-type again if a readout conduction potential of 5 V (VCC) is applied to the control gates 8-1 to 8-4 when a large amount of electrons e are present in the floating gates 6-1 to 6-4. For this reason, the cell transistor CT3 is made conductive by applying the readout conduction potential of 5 V is applied to the control gate 8-3. Therefore, a cell current flows between the source 2 and the drain 3 and the potential of a bit line (not shown) connected to the drain 3 is changed.

Next, the data writing operation is explained.

FIG. 19A is a cross sectional view for illustrating the operation of writing "0" level data, and FIG. 19B is a cross sectional view for illustrating the operation of writing "1" level data.

In order to write data, the gate 30 of the first selection transistor ST1 is set at the ground potential (0 V) and a potential of 11 V is applied to the gate 32 of the second selection transistor ST2 with the N-type substrate 21 and the P-type well region 22 kept at the ground potential (0 V).

In the above bias state, the conductivity type of the P⁻-type buried channel layer 33 is not inverted and only the conductivity type of the P⁻-type buried channel layer 34 is inverted. That is, the transistor ST1 is made non-conductive and the transistor ST2 is made conductive. In this state, a bit line (not shown) connected to the drain 3 is connected to a writing circuit (not shown).

First, when a cell transistor CT3 is selected from the cell block CB, for example, and "0" level data is written therein, a selection writing potential of 18 V (VPP) is applied only to the control gate 8-3 and a writing conduction potential of 9 V (VM) is applied to the other control gates 8-1, 8-2 and 8-4 as shown in FIG. 19A. When the potential of the bit line is set to 0 V by use of the writing circuit (not shown), a sufficiently intense electric field is applied between the floating gate 6-3 and the inverted layer 35-3 so as to cause an F-N tunnel current to flow from the floating gate 6-3 towards the inverted layer 35-3. As a result, electrons e are injected into the floating gate 6-3.

Portions denoted by the reference numerals 35-1 to 35-4 in FIG. 19A are large N-type layers constructed by the N⁻-type buried channel layers 20-1 to 20-4 shown in FIG. 17 and inverted layers formed by inverting the conductivity type of P-type surface channel layers 20-1' to 20-4' which lie between the N⁻-type buried channel layers 20-1 to 20-4 and the surface (substrate surface) of the well region Thus, a current can be caused to flow in portion near the gate insulation film at the time of writing operation by inverting the conductivity type of the P-type surface channel layers 20-1' to 20-4'.

In the NAND type E²PROM, injection of electrons into the floating gate is attained by use of a method for injecting electrons according to the F-N tunnel current instead of using a method for injecting hot electrons. In this invention, the large N-type layers 35-1 to 35-4 constructed by the two layers of the surface channel layer and the buried channel layer are formed at the time of writing operation, and with this structure, a method for injecting electrons according to the F-N tunnel current can be used as the writing method. Further, since an intense electric field can be applied to the gate insulation film, it becomes possible to easily pass the F-N tunnel current in the gate insulation film.

Further, by forming the large N-type layers 35-1 to 35-4, the resistance of the channel region obtained when the cell block CB is set in the conductive state becomes small. That is, it is possible to rapidly transmit the potential of the drain 3 to a cell transistor which is arranged at the end portion of the cell block.

On the other hand, as shown in FIG. 19B, when the cell transistor CT2 is selected from the cell block CB and "1" level data is written therein, a selection writing potential of 18 V (VPP) is applied only to the control gate 8-2 and a writing conduction potential of 9 V is applied to the other control gates 8-1, 8-3 and 8-4. Then, the bit line potential is set to 9 V (VM) by use of a writing circuit (not shown). In this bias state, since the electric field between the floating gate 6-2 and the N-type layer 35-2 in the channel region 4-2 becomes weak, no F-N tunnel current flows between the floating gate 6-2 and the inverted layer 35-2. As a result, no electrons e are injected into the floating gate 6-2.

Further, as shown in FIG. 18B, since the potential difference between the control gate and the channel region becomes low in each of the non-selected cell transistors CT1, CT3 and CT4, P-type surface channel layers 20-1', 20-3' and 20-4' lying between the surface of the well region 22 (substrate surface) and the N⁻-type buried channel layers 20-1, 20-3 and 20-4 appear. Then, since the PN junctions of the thus appearing P-type surface channel layers 20-1', 20-3' and 20-4' with the respective N⁻-type buried channel layers 20-1, 20-3 and 20-4 are reversely biased, the depletion layers therebetween are increased. As a result, it becomes possible to attain an advantage that the distance between the floating gate 6-3 and the N⁻-type buried channel layer 20-3 can be increased while electrons e are injected into the floating gate 6-3 of the cell transistor CT3 and thus the electrons e can be prevented from being easily extracted from the floating gate 6-3, for example, as shown in FIG. 19B.

Next, the data erasing operation is explained.

Figure 20:
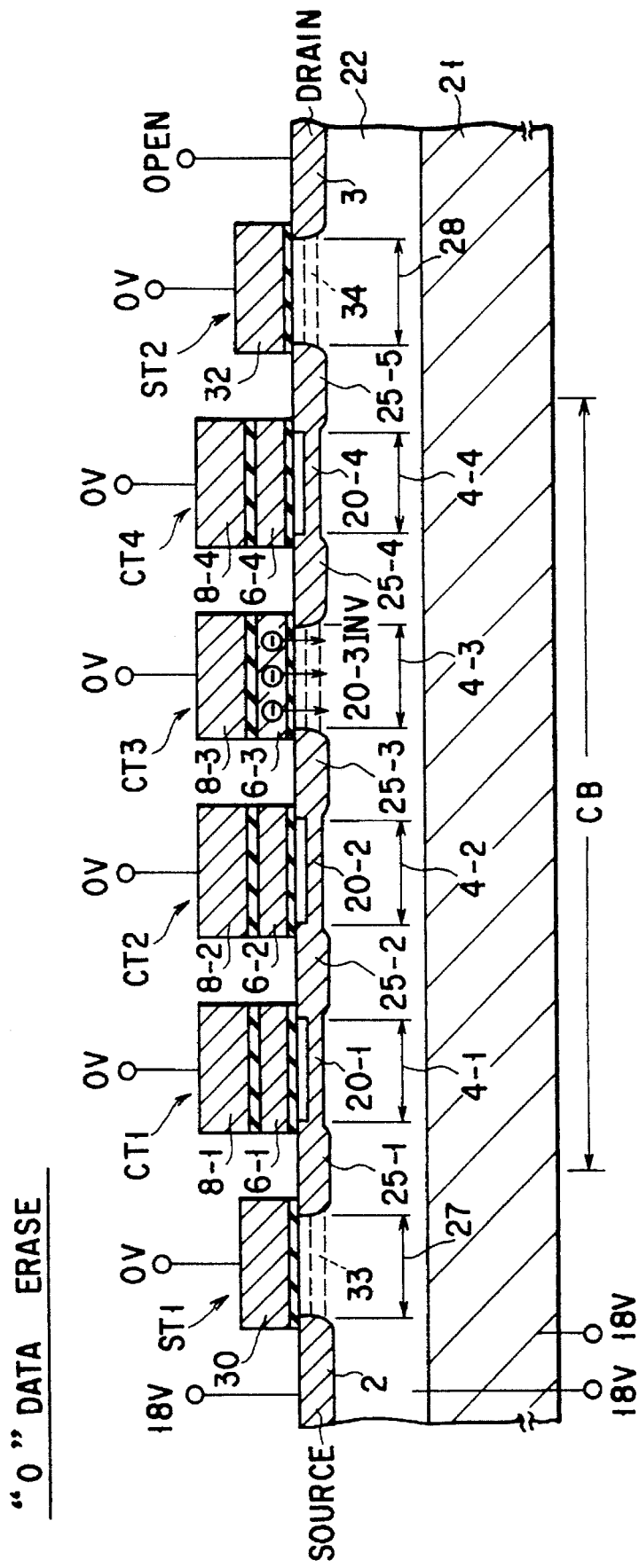
FIG. 20 is a cross sectional view for illustrating the erasing operation of the memory cell shown in FIG. 17.

FIG. 20 is a cross sectional view for illustrating the erasing operation in a case wherein electrons are extracted from the floating gate.

When data is erased, an erasing voltage of 18 V is applied to the source 2, N-type substrate 21 and P-type well region 22 and the control gates 8-1 to 8-4 and the selection gates 30, 32 are set at the ground potential (0 V) with the drain 3 kept open.

When the cell block CB is set in the above bias state, a sufficiently intense electric field is applied between the well region 22 and the control gates 8-1 to 8-4. Therefore, if electrons are present in the floating gate 6-3 as shown in FIG. 20, an F-N tunnel current flows between the floating gate 6-3 and the well region 22 so as to discharge the electrons e in the floating gate 6-3 into the well region 22. As a result, data is erased in the memory cell.

Further, the N⁻-type buried channel layers 20-1 to 20-4 are present between the floating gates 6-1 to 6-4 and the well region 22, but since the conductivity type of the N⁻-type buried channel layers 20-1 to 20-4 is changed to the P-type which is the same conductivity type as that of the well region 22 if electrons e are present in the floating gate, no influence is given to the data erasing operation.

The selection gates ST1 and ST2 may be single gate transistors shown in FIGS. 17 to 20 or may be stack gate transistors like the cell transistors CT1 to CT4. In the case the selection gates ST1 and ST2 are stack gate transistors, they can changed to normally-OFF type ones, merely by injecting electrons into their floating gates. This is well understood, particularly from the cell transistor CT3 shown in FIGS. 18A and 18B.

In the non-volatile semiconductor memory devices explained in the first to fourth embodiments, the inverted layer is formed in a deep portion at a distance from the substrate surface at the time of data readout and a reduction in the cell current caused by the interface state can be prevented by reading out data via the inverted layer formed in the deep portion. Therefore, the stable data readout operation can be attained for a long period of time.

Further, the inverted layer is formed to extend to the substrate surface at the time of data writing and the data writing operation is effected via the enlarged inverted layer so that the data writing speed can be enhanced.

In the case of data writing using channel hot carrier injection, for example, since hot carriers can be created in the deep portion of the substrate, the generation efficiency of the hot carriers can be enhanced. Therefore, hot carriers can be easily injected into the floating gate in a short period of time, thus enhancing the data writing speed.

In the case of data writing operation using the F-N tunnel current, the inverted layer is enlarged to reach the substrate surface so that the distance between the inverted layer and the floating gate can be reduced. For example, it can be set equal to the thickness of only the gate insulation film. Therefore, an intense electric field tends to be applied to the insulation layer and a large F-N tunnel current can be caused to flow. As a result, carriers can be injected into the floating gate in a short period of time.

Further, by enlarging the inverted layer to reach the substrate surface, the channel resistance of the cell transistor can be lowered. The low channel resistance is useful in the NAND type E²PROM having series-connected cell transistors. This is because the drain potential can be rapidly transmitted to a cell transistor which lies at the end portion of the cell block, that is, a cell transistor on the source side by lowering the channel resistance of each of the cell transistors.

Further, a lowering in the channel resistance is useful for lowering the operation voltage for the writing operation.

In the non-volatile semiconductor memory device according to this invention, since an amount of impurities doped into the channel region is large, the withstanding voltage of the source 2 may become low. Therefore, it is possible to extract electrons from the floating gate at the time of erasing operation by applying a negative potential of approximately −7.5 V, for example, to the control gate electrode and applying a potential of approximately 6.5 V, for example, to the source. An intense electric field can be created between the floating gate and the source by applying the negative potential to the control gate even if the source potential is low. Therefore, it becomes possible to erase data by using the F-N tunnel current and further lowering the source potential. As a result, at the time of erasing operation, the PN junction between the source 2 and the substrate 1 can be prevented from being broken down.

As described above, according to this invention, a non-volatile semiconductor memory device can be provided in which the data readout operation can be stably effected for a long period of time and the data writing speed can be enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device comprising:

a semiconductor substrate of one conductivity type;

a memory cell with respect to which at least the data writing operation can be effected and which includes a threshold variable type transistor including a channel region having one surface and provided in said semiconductor substrate, a gate insulation film provided on said one surface of said channel region, a gate provided on said gate insulation film, and a charge storage layer provided in said gate insulation film;

gate potential supplying means for supplying a readout potential to said gate at the time of data readout operation and supplying a writing potential higher than the readout potential to said gate at the time of data writing operation;

a surface channel layer provided in contact with said one surface in said channel region, the conductivity type thereof being inverted only when the writing potential is applied to said gate; and a buried channel layer provided in contact with said surface channel layer in said channel region, the conductivity type thereof being inverted when one of the readout potential and the writing potential is applied to said gate.

2. A non-volatile semiconductor memory device according to claim 1, wherein the carrier concentration of said buried channel layer is lower than the carrier concentration of said surface channel layer.

3. A non-volatile semiconductor memory device according to claim 2, wherein each of said surface channel layer and said buried channel layer has the same conductivity type as that of said substrate when said gate is grounded.

4. A non-volatile semiconductor memory device according to claim 3, wherein the impurity concentration of said buried channel layer is lower than the impurity concentration of said surface channel layer and said substrate.

5. A non-volatile semiconductor memory device according to claim 4, further comprising a semiconductor region of the one conductivity type provided in contact with said buried channel layer and having an impurity concentration greater than said substrate.

6. A non-volatile semiconductor memory device according to claim 2, wherein the effective carrier concentration of said surface channel layer is determined to such a value that the conductivity type thereof can always be inverted while the writing potential is supplied.

7. A non-volatile semiconductor memory device according to claim 6, wherein the effective carrier concentration of said surface channel layer is set to a value not larger than approximately $10^{18}$ cm$^{-3}$ when the writing potential is set to 10 V, and the effective carrier concentration of said surface channel layer is set to a value not larger than approximately $10^{17}$ cm$^{-3}$ when the writing potential is set to 8 V.

8. A non-volatile semiconductor memory device according to claim 3, wherein the conductivity type of said surface channel layer is not inverted and only the conductivity type of said buried channel layer is inverted when the readout potential is supplied to said gate and data stored in said memory cell is "1" level, and none of the conductivity types of said surface channel layer and said buried channel layer are inverted when the readout potential is supplied to said gate and data stored in said memory cell is "0" level.

9. A non-volatile semiconductor memory device according to claim 8, wherein both of the conductivity types of said surface channel layer and said buried channel layer are inverted when the writing potential is supplied to said gate and data stored in said memory cell is "1" level.

10. A non-volatile semiconductor memory device according to claim 9, wherein the amount of electrons stored in said charge storage layer is larger when the data is "0" level than when the data is "1" level.

11. A non-volatile semiconductor memory device according to claim 2, wherein said surface channel layer has the same conductivity type as that of said substrate and said buried channel layer has a different conductivity type from that of said substrate when said gate is grounded and data stored in said memory cell is "1" level.

12. A non-volatile semiconductor memory device according to claim 11, wherein only the conductivity type of said buried channel layer is inverted when said gate is grounded and data stored in said memory cell is "0" level.

13. A non-volatile semiconductor memory device according to claim 12, wherein only the conductivity type of said surface channel layer is inverted when the writing potential is supplied to said gate and data stored in said memory cell is "1" level.

14. A non-volatile semiconductor memory device according to claim 13, wherein the amount of electrons stored in said charge storage layer is larger when the data is "0" level than when the data is "1" level.

15. A non-volatile semiconductor memory device comprising:

a semiconductor substrate of a first conductivity type;

a first memory cell with respect to which at least the data writing operation can be effected and which includes a threshold variable type transistor including a channel region having one surface and provided in said semiconductor substrate, a gate insulation film provided on said one surface of said channel region, a gate provided on said gate insulation film, a charge storage layer provided in said gate insulation film, a first terminal region of a second conductivity type provided in contact with said channel region in said substrate, and a second terminal region of said second conductivity type connected to a source and provided in contact with said channel region in said substrate;

a second memory cell with respect to which at least the data writing operation can be effected and which includes a threshold variable type transistor including a channel region having one surface and provided in said semiconductor substrate, a gate insulation film provided on said one surface of said channel region, a gate provided on said gate insulation film, a charge storage layer provided in said gate insulation film, a first terminal region of said second conductivity type provided in contact with said channel region in said substrate and connected to said first terminal region of said first memory cell, and a second terminal region of said second conductivity type connected to a drain and provided in contact with said channel region in said substrate;

gate potential supplying means for supplying a readout conduction potential to one of said gates of said first and second memory cells and supplying a selection readout potential to the other gate at the time of data readout operation and supplying a writing conduction potential higher than the readout conduction potential to one of said gates of said first and second memory cells and supplying a selection writing potential to the other gate at the time of data writing operation;

a first surface channel layer provided in contact with said one surface in said channel region of said first memory cell, the conductivity type thereof being inverted only when said drain is grounded and one of the writing conduction potential and the selection writing potential is supplied;

a first buried channel layer provided in contact with said first surface channel layer in said channel region of said first memory cell and having a carrier concentration lower than that of said first surface channel layer;

a second surface channel layer provided in contact with said one surface in said channel region of said second memory cell, the conductivity type thereof being inverted only when said drain is grounded and one of the writing conduction potential and the selection writing potential is supplied; and a second buried channel layer provided in contact with said second surface channel layer in said channel region of said second memory cell and having a carrier concentration lower than that of said second surface channel layer.

16. A non-volatile semiconductor memory device according to claim 15, wherein said first surface channel layer has the same conductivity type as that of said substrate and said first buried channel layer has a different conductivity type from that of said substrate when said gate is grounded and data stored in said first memory cell is "1" level; only the conductivity type of said first buried layer is inverted when said gate is grounded and data stored in said first memory cell is "0" level; said second surface channel layer has the same conductivity type as that of said substrate and said second buried channel layer has a different conductivity type from that of said substrate when said gate is grounded and data stored in said second memory cell is "1" level; and only the conductivity type of said second buried layer is inverted when said gate is grounded and data stored in said second memory cell is "0" level.

17. A non-volatile semiconductor memory device according to claim 16, wherein the amount of electrons stored in said charge storage layer is larger when the data is "0" level than when the data is "1" level.

18. A non-volatile semiconductor memory device comprising:

a semiconductor substrate; and a memory cell with respect to which at least the data writing operation can be effected and which includes a channel region of a two-layered structure having a surface channel layer and a buried channel layer provided in said semiconductor substrate, a gate insulation film provided on said surface channel layer, a gate provided on said gate insulation film, and a charge storage layer provided in said gate insulation film;

wherein the operation of reading out data from said memory cell is effected by using only said buried channel layer and determining data of "1" level or "0" level according to whether the conductivity type of said buried channel layer is the same as the conductivity type of said substrate or not; and the operation of writing "0" level data into said memory cell is effected by using both of said surface channel layer and said buried channel layer, simultaneously making the conductivity types of said surface channel layer and said buried channel layer different from the conductivity type of said substrate, and passing a current into said surface channel layer and said buried channel layer to inject carriers into said charge storage layer.

19. A non-volatile semiconductor memory device according to claim 18, wherein the carrier concentration of said buried channel layer is lower than the carrier concentration of said surface channel layer.

20. A non-volatile semiconductor memory device according to claim 19, wherein the amount of electrons stored in said charge storage layer is larger when the data is "0" level than when the data is "1" level.

21. A non-volatile semiconductor memory device comprising:
   a semiconductor substrate of one conductivity type;
   a memory cell including a channel region having a deep layer and a surface layer arranged between said deep layer and a surface of said semiconductor substrate, a control gate, and a charge storage layer; and
   a gate potential supplying circuit for supplying first and second potentials to said control gate, said first potential providing an inverted or non-inverted layer in said deep layer of said channel region based on data stored in said memory cell and said second potential causing the conductivity type of both said deep layer of said channel region and said surface layer of said channel region to be different than the one conductivity type of said semiconductor substrate.

22. A non-volatile semiconductor memory device according to claim 21, wherein said memory cell includes a normally-OFF type cell transistor.

23. A non-volatile semiconductor memory device according to claim 22, wherein said first potential is readout potential and said second potential is programming potential.

24. A non-volatile semiconductor memory device according to claim 23, wherein said readout potential is VCC, and said programming potential is VPP.

25. A non-volatile semiconductor memory device according to claim 21, wherein said memory cell includes a normally-ON type cell transistor.

26. A non-volatile semiconductor memory device according to claim 25, wherein said first potential is ground potential and said second potential is programing potential.

27. A non-volatile semiconductor memory device according to claim 26, wherein said ground potential is VSS, and said programming potential is VPP.

28. A non-volatile semiconductor memory device according to claim 25, wherein said normally-ON type cell transistor includes NAND type cell transistor.

29. A non-volatile semiconductor memory device according to claim 28, wherein said first potential is ground potential and said second potential is programing potential.

30. A non-volatile semiconductor memory device according to claim 29, wherein said ground potential is VSS, and said programing potential is VM.

31. A non-volatile semiconductor memory device, comprising:
   a body of semiconductor material of a first conductivity type;
   a non-volatile memory cell transistor having source and drain regions of a second conductivity type formed in said semiconductor body and defining a channel region therebetween, a control gate, and a charge storage layer, wherein said channel region includes a buried channel layer, and a surface channel layer formed between said buried channel layer and a surface of said semiconductor body;
   a gate potential supplying circuit for supplying a reading potential to said control gate during a data reading operation for reading data from said non-volatile memory cell transistor and for supplying a writing potential to said control gate during a data writing operation for writing data to said non-volatile memory cell transistor,
   wherein the conductivity type of said buried channel layer, but not said surface channel layer, is inverted or not inverted during the data reading operation based on the data read from said non-volatile memory cell transistor and the reading potential supplied to said control gate, and the conductivity type of both said buried channel layer and said surface channel layer is different than the conductivity type of said semiconductor body during the data writing operation based on the writing potential supplied to said control gate.

32. A non-volatile semiconductor memory device according to claim 31, wherein the carrier concentration of said buried channel layer is lower than the carrier concentration of said surface channel layer.

33. A non-volatile semiconductor memory device according to claim 32, wherein each of said surface channel layer and said buried channel layer is of the same conductivity type as the conductivity type of said semiconductor body when said control gate is supplied with a ground potential.

34. A non-volatile semiconductor memory device according to claim 33, wherein the impurity concentration of said buried channel layer is lower than the impurity concentration of said surface channel layer and said semiconductor body.

35. A non-volatile semiconductor memory device according to claim 34, further comprising:
   a semiconductor region of the first conductivity type provided in contact with said buried channel layer and having an impurity concentration greater than the impurity concentration of said semiconductor body.

36. A non-volatile semiconductor memory device according to claim 32, wherein the carrier concentration of said surface channel layer is set such that the conductivity type thereof is always inverted when said gate potential supplying circuit supplies the writing potential to said control gate.

37. A non-volatile semiconductor memory device according to claim 36, wherein the carrier concentration of said surface channel layer is not greater than approximately $10^{18}$ $cm^{-3}$ if said gate potential supplying circuit is set to supply a writing potential of 10 volts, and the carrier concentration of said surface channel layer is not greater than approximately $10^{17}$ $cm^{-3}$ if said gate potential supplying circuit is set to supply a writing potential of 8 volts.

38. A non-volatile semiconductor memory device according to claim 33, wherein the conductivity type of said buried channel layer, but not said surface channel layer, is inverted when said gate potential supplying circuit supplies the reading potential to said control gate and the data stored in said non-volatile semiconductor memory cell is data of a first logic level, and the conductivity type of neither said buried channel layer nor said surface channel layer is inverted when said gate potential supplying circuit supplies the reading potential to said control gate and the data stored in said non-volatile semiconductor memory cell is data of a second logic level.

39. A non-volatile semiconductor memory device according to claim 38, wherein said charge storage layer stores more electrons for data of the second logic level than for data of the first logic level.

40. A non-volatile semiconductor memory device according to claim 32, wherein said surface channel layer is of the same conductivity type as said semiconductor body and said buried channel layer is of a different conductivity type as said semiconductor body when said gate is supplied with ground potential and said non-volatile memory cell transistor stores data of a first logic level.

41. A non-volatile semiconductor memory device according to claim 40, wherein the conductivity type of only said buried channel layer is inverted when said gate is supplied with ground potential and said non-volatile memory cell transistor stores data of a second logic level.

42. A non-volatile semiconductor memory device according to claim 41, wherein the conductivity type of only said surface channel layer is inverted when said gate potential supplying circuit supplies the writing potential to said control gate and said non-volatile memory cell transistor stores data of the first logic level.

43. A non-volatile semiconductor memory device according to claim 42, wherein said charge storage layer stores more electrons for data of the second logic level than for data of the first logic level.

44. A semiconductor device, comprising:
   a body of semiconductor material of a first conductivity type;
   a transistor including source and drain regions of a second conductivity type formed in said semiconductor body and defining a channel region therebetween and a gate insulatively spaced from said channel region, wherein said channel region comprises at least two channel layers; and
   a gate potential supplying circuit for supplying a gate potential to said gate,
   wherein the conductivity types of said at least two channel layers are separately invertible in accordance with the gate potential supplied to said gate, and
   wherein said at least two channel layers comprise a buried channel layer, and a surface channel layer formed between said buried channel layer and a surface of said semiconductor body and the conductivity type of said buried channel layer, but not said surface channel layer, is inverted when the gate potential supplied to said gate turns said transistor ON.

45. A non-volatile semiconductor memory device, comprising:
   a body of semiconductor material of a first conductivity type;
   a NAND memory cell block comprising a plurality of non-volatile memory cell transistors, each non-volatile memory cell transistor having source and drain regions of a second conductivity type formed in said semiconductor body and defining a channel region therebetween, a control gate, and a charge storage layer, wherein said channel region includes a buried channel layer, and a surface channel layer formed between said buried channel layer and a surface of said semiconductor body;
   a gate potential supplying circuit for supplying a reading potential to the gate of a first of said non-volatile memory cell transistors during a data reading operation for reading data from said first non-volatile memory cell transistor and for supplying a writing potential to the gate of a second of said non-volatile memory cell transistors during a data writing operation for writing data to said second non-volatile memory cell transistor,
   wherein the conductivity type of the buried channel layer, but not the surface channel layer, of said first non-volatile memory cell transistor is inverted or not inverted during the data reading operation based on the data read from said first non-volatile memory cell transistor and the reading potential supplied to the control gate of said first non-volatile memory cell transistor, and the conductivity type of both the buried channel layer and the surface channel layer of said second non-volatile memory cell transistor is different than the conductivity type of said semiconductor body during the data writing operation based on the writing potential supplied to the control gate of said second non-volatile memory cell transistor.

46. A non-volatile semiconductor memory device according to claim 45, further comprising:
   a selection transistor connected to one end of said NAND cell block, said selection transistor having source and drain regions of a second conductivity type formed in said semiconductor body and defining a channel region therebetween and a control gate, wherein said channel region includes a buried channel layer, and a surface channel layer formed between said buried channel layer and a surface of said semiconductor body,
   wherein the conductivity type of said buried channel layer, but not said surface channel layer, is inverted when said selection transistor is turned ON.

47. A non-volatile semiconductor memory device, comprising:
   a body of semiconductor material of a first conductivity type;
   a memory cell having source and drain regions of a second conductivity type formed in said semiconductor body and defining a channel region therebetween, a control gate, and a charge storage layer, wherein said channel region includes a buried channel layer, and a surface channel layer of the first conductivity type formed between said buried channel layer and a surface of said semiconductor body; and
   a gate potential supplying circuit for supplying a reading potential to said control gate during a data reading operation for reading data from said memory cell and for supplying a writing potential to said control gate during a data writing operation for writing data to said memory cell,
   wherein, during the data reading operation, no current flows in said surface channel layer and the data is read from said memory cell based on a current flow or no current flow in said buried channel layer and, during the data writing operation, data is written to said memory cell based on a current flow in both said buried channel layer and said surface channel layer.

48. A method of operating a non-volatile semiconductor memory device which includes a semiconductor substrate of one conductivity type; a memory cell with respect to which at least the data writing operation can be effected and which includes a threshold variable type transistor including a channel region having one surface and provided in said semiconductor substrate, a gate insulation film provided on said one surface of said channel region, a gate provided on said gate insulation film, and a charge storage layer provided in said gate insulation film; a surface channel layer provided in contact with said one surface in said channel region; and a buried channel layer provided in contact with said surface channel layer in said channel region, the method comprising the steps of:
   supplying a readout potential to said gate at the time of data readout operation to invert or not invert the conductivity type of said buried channel layer based on the readout data; and
   supplying a writing potential higher than the readout potential to said gate at the time of data writing operation to cause the conductivity type of both said buried channel layer and said surface channel layer to be different than the conductivity type of said semiconductor substrate.

49. A method according to claim 48, wherein the carrier concentration of said buried channel layer is lower than the carrier concentration of said surface channel layer.

50. A method according to claim 49, wherein each of said surface channel layer and said buried channel layer is of the same conductivity type as said semiconductor substrate when said gate is supplied with a ground potential.

51. A method according to claim 50, wherein the impurity concentration of said buried channel layer is lower than the impurity concentration of said surface channel layer and said semiconductor substrate.

52. A method according to claim 51, wherein said non-volatile semiconductor memory device further comprises a semiconductor region of the one conductivity type provided in contact with said buried channel layer and having an impurity concentration greater than the impurity concentration of said semiconductor substrate.

53. A method according to claim 49, further comprising setting the carrier concentration of said surface channel layer such that the conductivity type thereof is always inverted when the writing potential is supplied to said gate.

54. A method according to claim 53, further comprising setting the carrier concentration of said surface channel layer to a value not larger than approximately $10^{18}$ cm$^{-3}$ if the writing potential is set to 10 V, and setting the carrier concentration of said surface channel layer to a value not larger than approximately $10^{17}$ cm$^{-3}$ if the writing potential is set to 8 V.

55. A method according to claim 50, wherein the conductivity type of said surface channel layer is not inverted and only the conductivity type of said buried channel layer is inverted when the reading potential is supplied to said gate and data stored in said memory cell is data of a first logic level, and none of the conductivity types of said surface channel layer and said buried channel layer are inverted when the readout potential is supplied to said gate and data stored in said memory cell is data of a second logic level.

56. A method according to claim 55, wherein both of the conductivity types of said surface channel layer and said buried channel layer are inverted when the writing potential is supplied to said gate and data stored in said memory cell is data of the first logic level.

57. A method according to claim 56, wherein said charge storage layer stores more electrons for data of the second logic level than for data of the first logic level.

58. A method according to claim 49, wherein said surface channel layer is of the same conductivity type as said semiconductor substrate and said buried channel layer is of a different conductivity type as said semiconductor substrate when ground potential is supplied to said gate and said memory cell stores data of a first logic level.

59. A method according to claim 58, wherein the conductivity type of only said buried channel layer is inverted when ground potential is supplied to said gate and said memory cell stores data of a second logic level.

60. A method according to claim 59, wherein the conductivity type of only said surface channel layer is inverted when the writing potential is supplied to said gate and data stored in said memory cell is data of the first logic level.

61. A method according to claim 60, wherein said charge storage layer stores more electrons for data of the second logic level than for data of the first logic level.

62. A method of operating a non-volatile semiconductor memory device which includes a semiconductor substrate of a first conductivity type; a first memory cell with respect to which at least the data writing operation can be effected and which includes a threshold variable type transistor including a channel region having one surface and provided in said semiconductor substrate, a gate insulation film provided on said one surface of said channel region, a gate provided on said gate insulation film, a charge storage layer provided in said gate insulation film, a first terminal region of a second conductivity type provided in contact with said channel region in said substrate, and a second terminal region of said second conductivity type connected to a source and provided in contact with said channel region in said substrate; a first surface channel layer provided in contact with said one surface in said channel region of said first memory cell; a first buried channel layer provided in contact with said first surface channel layer in said channel region of said first memory cell and having a carrier concentration lower than that of said first surface channel layer; a second memory cell with respect to which at least the data writing operation can be effected and which includes a threshold variable type transistor including a channel region having one surface and provided to said semiconductor substrate, a gate insulation film provided on said one surface of said channel region, a gate provided on said gate insulation film, a charge storage layer provided in said gate insulation film, a first terminal region of said second conductivity type provided in contact with said channel region in said substrate and connected to said first terminal region of said first memory cell, and a second terminal region of said second conductivity type connected to a drain and provided in contact with said channel region in said substrate; a second surface channel layer provided to contact with said one surface in said channel region of said second memory cell; and a second buried channel layer provided in contact with said second surface channel layer in said channel region of said second memory cell and having a carrier concentration lower than that of said second surface channel layer, the method comprising the steps of:

supplying readout conduction potential to one of said gates of said first and second memory cells and supplying a selection readout potential to the other gate at the time of data readout operation; and supplying a writing conduction potential higher than the readout conduction potential to one of said gates of said first and second memory cells and supplying a selection writing potential to the other gate at the time of data writing operation to invert the conductivity type of one of said first and second surface channel layers.

63. A method according to claim 62, wherein said first surface channel layer has the same conductivity type as that of said substrate and said first buried channel layer has a different conductivity type from that of said substrate when ground potential is supplied to said gate of said first memory cell and data stored in said first memory cell is data of a first logic level; only the conductivity type of said first buried layer is inverted when ground potential is supplied to said gate of said first memory cell and data stored in said first memory cell is data of a second logic level; said second surface channel layer has the same conductivity type as that of said substrate and said second buried channel layer has a different conductivity type from that of said substrate when ground potential is supplied to said gate of said second memory cell and data stored in said second memory cell is data of the first logic level; and only the conductivity type of said second buried layer is inverted when ground potential is supplied to said gate of said second memory cell and data stored in said second memory cell is data of the second logic level.

64. A method according to claim 63, wherein said charge storage layer stores more electrons for data of the second logic level than for data of the first logic level.

65. A method of operating a non-volatile semiconductor memory device which includes a semiconductor substrate of one conductivity type; and a memory cell including a channel region having a deep layer and a surface layer arranged between said deep layer and a surface of said semiconductor substrate, a control gate, and a charge storage layer, the method comprising the steps of:

supplying a first potential to said control gate, said first potential providing an inverted or non-inverted layer in said deep layer of said channel region based on the data stored in said memory cell; and supplying a second potential to said control gate, said second potential causing the conductivity type of both said channel region and said surface layer of said channel region to be different than the conductivity type of said semiconductor substrate.

66. A method according to claim 65, wherein said memory cell includes a normally-OFF type cell transistor.

67. A method according to claim 66, wherein said first potential is readout potential and said second potential is programming potential.

68. A method according to claim 67, wherein said readout potential is VCC, and said programming potential is VPP.

69. A method according to claim 65, wherein said memory cell includes a normally-ON type cell transistor.

70. A method according to claim 69, wherein said first potential is ground potential and said second potential is programming potential.

71. A method according to claim 70, wherein said ground potential is VSS, and said programming potential is VPP.

72. A method according to claim 69, wherein said normally-ON type cell transistor includes a NAND type cell transistor.

73. A method according to claim 72, wherein said first potential is ground potential and said second potential is programming potential.

74. A method according to claim 73, wherein said ground potential is VSS, and said programming potential is VM.

75. A method of operating non-volatile semiconductor memory device which includes a body of semiconductor material of a first conductivity type; and a non-volatile memory cell transistor having source and drain regions of a second conductivity type formed in said semiconductor body and defining a channel region therebetween, a control gate, and a charge storage layer, wherein said channel region includes a buried channel layer, and a surface channel layer formed between said buried channel layer and a surface of said semiconductor body, the method comprising the steps of:

supplying a reading potential to said control gate during a data reading operation for reading data from said non-volatile memory cell transistor; and supplying a writing potential higher than the reading potential to said control gate during a data writing operation for writing data to said non-volatile memory cell transistor, wherein the conductivity type of said buried channel layer, but not said surface channel layer, is inverted or not inverted during the data reading operation based on the data read from said non-volatile memory cell transistor and the reading potential supplied to said control gate, and the conductivity type of both said buried channel layer and said surface channel layer is different than the conductivity type of said semiconductor body during the data writing operation based on the writing potential supplied to said control gate.

76. A method according to claim 75, wherein the carrier concentration of said buried channel layer is lower than the carrier concentration of said surface channel layer.

77. A method according to claim 76, wherein each of said surface channel layer and said buried channel layer is of the same conductivity type as the conductivity type of said semiconductor body when said control gate is supplied with a ground potential.

78. A method according to claim 77, wherein the impurity concentration of said buried channel layer is lower than the impurity concentration of said surface channel layer and said semiconductor body.

79. A method according to claim 78, wherein said non-volatile semiconductor memory device further comprises a semiconductor region of the first conductivity type provided in contact with said buried channel layer and having an impurity concentration greater than the impurity concentration of said semiconductor body.

80. A method according to claim 79, wherein the carrier concentration of said surface channel layer is set such that the conductivity type thereof is always inverted when the writing potential is supplied to said control gate.

81. A method according to claim 80, wherein the carrier concentration of said surface channel layer is not greater than approximately $10^{18}$ cm$^{-3}$ when a writing potential of 10 volts is supplied, and the carrier concentration of said surface channel layer is not greater than approximately $10^{17}$ cm$^{-3}$ when a writing potential of 8 volts is supplied.

82. A method according to claim 77, wherein the conductivity type of said buried channel layer, but not said surface channel layer, is inverted when the reading potential is supplied to said control gate and the data stored in said non-volatile semiconductor memory cell is data of a first logic level, and the conductivity type of neither said buried channel layer nor said surface channel layer is inverted when the reading potential is supplied to said control gate and the data stored in said non-volatile semiconductor memory cell is data of a second logic level.

83. A method according to claim 82, wherein said charge storage layer stores more electrons for data of the second logic level than for data of the first logic level.

84. A method according to claim 76, wherein said surface channel layer is of the same conductivity type as said semiconductor body and said buried channel layer is of a different conductivity type as said semiconductor body when said gate is supplied with ground potential and said non-volatile memory cell transistor stores data of a first logic level.

85. A method according to claim 84, wherein the conductivity type of only said buried channel layer is inverted when said gate is supplied with ground potential and said non-volatile memory cell transistor stores data of a second logic level.

86. A method according to claim 85, wherein the conductivity type of only said surface channel layer is inverted when the writing potential is supplied to said control gate and said non-volatile memory cell transistor stores data of the first logic level.

87. A method according to claim 86, wherein said charge storage layer stores more electrons for data of the second logic level than for data of the first logic level.

88. A method of operating a non-volatile semiconductor memory device which includes a body of semiconductor material of a first conductivity type; a NAND memory cell block comprising a plurality of non-volatile memory cell transistors, each non-volatile memory cell transistor having source and drain regions of a second conductivity type formed in said semiconductor body and defining a channel region therebetween, a control gate, and a charge storage layer, wherein said channel region includes a buried channel layer, and a surface channel layer formed between said buried channel layer and a surface of said semiconductor body, the method comprising the steps of:

supplying a reading potential to the gate of a first of said non-volatile memory cell transistors during a data reading operation for reading data from said first non-volatile memory cell transistor; and supplying a writing potential higher than the reading potential to the gate of a second of said non-volatile memory cell transistors during a data writing operation for writing data to said second non-volatile memory cell transistor, wherein the conductivity type of the buried channel layer, but not the surface channel layer, of said first non-volatile memory cell transistor is inverted or not inverted during the data reading operation based on the data read from said first non-volatile memory cell transistor and the reading potential supplied to the control gate of said first non-volatile memory cell transistor, and the conductivity type of both the buried channel layer and the surface channel layer of said second non-volatile memory cell transistor is different than the conductivity type of said semiconductor body during the data writing operation based on the writing potential supplied to the control gate of said second non-volatile memory cell transistor.

89. A method according to claim 88, wherein said non-volatile semiconductor memory device further comprises a selection transistor connected to one end of said NAND cell block, said selection transistor having source and drain regions of a second conductivity type formed in said semiconductor body and defining a channel region therebetween and a control gate provided over said semiconductor body, wherein said channel region includes a buried channel layer, and a surface channel layer formed between said buried channel layer and a surface of said semiconductor body, and the method comprises the further step of applying a potential to the control gate of said selection transistor, wherein the conductivity type of said buried channel layer, but not said surface channel layer, is inverted when said selection transistor is turned ON.

* * * * *